(12) United States Patent
Sung

(10) Patent No.: US 7,371,280 B2
(45) Date of Patent: *May 13, 2008

(54) HIGH PRESSURE CRYSTAL GROWTH APPARATUSES AND ASSOCIATED METHODS

(76) Inventor: Chien-Min Sung, 64 Chung-San Road, Ying Ko Factory, Taipei County (TW) 23911

( * ) Notice: Subject to any disclaimer, the term of this patent is extended or adjusted under 35 U.S.C. 154(b) by 181 days.

This patent is subject to a terminal disclaimer.

(21) Appl. No.: 11/211,139

(22) Filed: Aug. 24, 2005

(65) Prior Publication Data

US 2006/0032431 A1 Feb. 16, 2006

Related U.S. Application Data

(60) Division of application No. 10/775,042, filed on Feb. 6, 2004, which is a continuation-in-part of application No. 10/757,715, filed on Jan. 13, 2004, now Pat. No. 7,128,547.

(51) Int. Cl.
*C30B 9/00* (2006.01)
(52) U.S. Cl. ............................ 117/11; 425/77; 423/446
(58) Field of Classification Search ............... 425/1; 117/1; 264/1; 423/1
See application file for complete search history.

(56) References Cited

U.S. PATENT DOCUMENTS

| | | | |
|---|---|---|---|
| 2,941,247 A | 6/1960 | Bundy | |
| 2,941,248 A | 6/1960 | Hall | |
| 2,947,610 A | 8/1960 | Hall et al. | |
| 3,030,661 A | 4/1962 | Strong | |
| 3,031,269 A | 4/1962 | Bovenkerk | |
| 3,075,245 A | 1/1963 | Bundy | |
| 3,084,388 A | 4/1963 | Ballhausen | |
| 3,088,169 A | 5/1963 | Wentorf, Jr. | |
| 3,137,896 A | 6/1964 | Daniels | |
| 3,159,876 A | 12/1964 | Hall | |
| 3,179,979 A | 4/1965 | Bundy et al. | |
| 3,271,502 A | 9/1966 | Wentorf, Jr. | |
| 3,297,407 A | 1/1967 | Wentorf, Jr. | |
| 3,332,747 A | 7/1967 | Bundy | |
| 3,365,751 A | 1/1968 | Ishizuka | |
| 3,423,177 A * | 1/1969 | Bovenkerk | .............. 423/446 |
| 3,488,153 A | 1/1970 | Bundy | |

(Continued)

OTHER PUBLICATIONS

U.S. Appl. No. 11/211,140, filed Aug. 24, 2005.*

(Continued)

*Primary Examiner*—Robert Kunemund
*Assistant Examiner*—Marissa W. Chaet
(74) *Attorney, Agent, or Firm*—Thorpe North & Western LLP

(57) ABSTRACT

High pressure synthesis of various crystals such as diamond, cBN and the like can be carried out using reaction assemblies suitable for use in methods such as temperature gradient methods. The reaction assembly can be oriented substantially perpendicular to gravity during application of high pressure. Orienting the reaction assembly in this manner can avoid detrimental effects of gravity on the molten catalyst, e.g., convection, hence increasing available volumes for growing high quality crystals. Multiple reaction assemblies can be oriented in series or parallel, each reaction assembly having one or more growth cells suitable for growth of high quality crystals. Additionally, various high pressure apparatuses can be used. A split die design allows for particularly effective results and control of temperature and growth conditions for individual crystals.

17 Claims, 11 Drawing Sheets

U.S. PATENT DOCUMENTS

| | | |
|---|---|---|
| 3,492,695 A | 2/1970 | Kuratomi |
| 3,529,324 A | 9/1970 | Kawai |
| 3,695,797 A | 10/1972 | Bakul et al. |
| 3,797,986 A | 3/1974 | Onder |
| 3,914,078 A | 10/1975 | Kendall |
| 3,915,605 A | 10/1975 | Vereschagin et al. |
| 4,034,066 A | 7/1977 | Strong et al. |
| 4,042,673 A | 8/1977 | Strong |
| 4,287,168 A | 9/1981 | Wentorf, Jr. et al. |
| 4,302,168 A | 11/1981 | Khvostantsev |
| 4,322,396 A | 3/1982 | Strong |
| 4,340,576 A | 7/1982 | Strong |
| 4,547,257 A | 10/1985 | Iizuka et al. |
| 4,632,817 A | 12/1986 | Yazu et al. |
| 4,740,147 A | 4/1988 | Asari et al. |
| 4,797,241 A | 1/1989 | Peterson et al. |
| 4,836,881 A | 6/1989 | Satoh et al. |
| 5,273,730 A | 12/1993 | Yoshida et al. |
| 5,772,756 A | 6/1998 | Davies et al. |
| 5,980,852 A | 11/1999 | Burns et al. |
| 6,159,286 A | 12/2000 | Sung |

OTHER PUBLICATIONS

Hall, H. Tracy, "High Pressure-Temperature Apparatus," Conference on Metallurgy at High Pressure, Chapter 4, 1964.

Sung, Chien-Min, "A Century of Progress in the Development of Very High Pressure Apparatus for Scientific Reserach and Diamond Synthesis," High Temperatures—High Pressures, 1997, vol. 29, pp. 253-293.

* cited by examiner

HIGH PRESSURE CRYSTAL GROWTH APPARATUSES AND ASSOCIATED METHODS

PRIORITY DATA

This application is a divisional of U.S. patent application Ser. No. 10/775,042, filed Feb. 6, 2004, which is a continuation-in-part of U.S. patent application Ser. No. 10/757,715, filed Jan. 13, 2004 now U.S. Pat. No. 7,128,547, both of which are herein incorporated by reference.

FIELD OF THE INVENTION

The present invention relates generally to devices and methods for growing crystalline materials at high pressures and high temperatures. Accordingly, the present invention involves the fields of chemistry, metallurgy, materials science, physics, and high pressure technology.

BACKGROUND OF THE INVENTION

Apparatuses for achieving high pressures have been known for over a half century. Typical ultrahigh pressure apparatuses include piston-cylinder presses, cubic presses, tetrahedral presses, belt presses, girdle presses, and the like. Several of these apparatuses are capable of achieving ultrahigh pressures from about 4 GPa to about 7 GPa.

High pressure apparatuses are commonly used to synthesize diamond and cubic boron nitride (cBN). Generally, source materials and other raw materials can be selected and assembled into a high pressure assembly which is then placed in the high pressure apparatus. Under high pressure, and typically high temperature, the raw materials combine to form the desired product. More specifically, graphite, non-diamond carbon or even diamond can be used as a source material in diamond synthesis, while hexagonal boron nitride (hBN) can be used in cBN synthesis. The raw material can then be mixed or contacted with a catalyst material. Diamond synthesis catalysts such as Fe, Ni, Co, and alloys thereof are commonly used. Alkalis, alkaline earth metals, or compounds of these materials can be used as the catalyst material in cBN synthesis. The raw material and catalyst material can then be placed in a high pressure apparatus wherein the pressure is raised to an ultrahigh pressure, e.g., 5.5 GPa. An electrical current can then be passed through either a graphite heating tube or graphite directly. This resistive heating of the catalyst material is sufficient to cause melting of the catalyst material, e.g., typically about 1300° C. for diamond synthesis and about 1500° C. for cBN synthesis. Under such conditions, the source material can dissolve into the catalyst and then precipitate out in a crystalline form as either diamond or cBN.

Typically, either an isothermal method or temperature gradient method is used to synthesize diamond. Each method takes advantage of the solubility of carbon under various conditions, e.g., temperature, pressure, and concentrations of materials. The isothermal method involves use of a carbon source material, metal catalyst, and sometimes a diamond seed. The carbon source is most frequently graphite or other forms of carbon material. Under high pressures and high temperatures, graphite is much more soluble in molten catalyst than diamond. Therefore, graphite tends to dissolve or disperse into the molten catalyst, or create a colloidal suspension therewith, up to the saturation point. Excess carbon can then precipitate out as diamond. Typically, a diamond seed can be surrounded by a thin envelope of molten catalyst, e.g., Fe, Ni, Co, and their alloys. In this case, the carbon can dissolve into and diffuse across the molten catalyst envelope toward the diamond seed of a diamond nucleus. Due to the presence of a thin molten catalyst layer, this type of isothermal process is also often referred to as a thin film process.

In contrast, the temperature gradient method involves maintaining a temperature gradient between a carbon source and the diamond seeds which are separated by a relatively thick layer of molten catalyst. The carbon source is kept at a relatively higher temperature than the diamond seed. As such, the carbon is more soluble in the hotter regions. The carbon then diffuses toward the cooler region where the diamond seed is located. The solubility of carbon is reduced in the cooler regions, thus allowing carbon to precipitate as diamond at the diamond seed. Typically, the molten catalyst layer is relatively thick in order to maintain a sufficient temperature gradient, e.g., 20° C. to 50° C., and is therefore also often referred to as a thick film process.

Unfortunately, currently known high pressure crystal synthesis methods have several drawbacks which limit their ability to produce large, high-quality crystals. For example, isothermal processes are generally limited to production of smaller crystals useful as superabrasives in cutting, abrading, and polishing applications. Temperature gradient processes can be used to produce larger diamonds; however, production capacity and quality are limited. Several methods have attempted to overcome these limitations. Some methods incorporate multiple diamond seeds; however, a temperature gradient among the seeds prevents achieving optimal growth conditions at more than one seed. Some methods involve providing two or more temperature gradient reaction assemblies such as those described in U.S. Pat. No. 4,632,817. Unfortunately, high quality diamond is typically produced only in the lower portions of these reaction assemblies. Some of these methods involve adjusting the temperature gradient to compensate for some of these limitations. However, such methods involve additional expense and variables in order to control growth rates and diamond quality simultaneously over different temperatures and growth materials.

Therefore, apparatuses and methods which overcome the above difficulties would be a significant advancement in the area of high pressure crystal growth.

SUMMARY OF THE INVENTION

It has been recognized by the inventor that it would be advantageous to develop methods and devices which allow for larger production throughput, decreased production costs, and improved quality of large synthetic crystals such as diamond, cBN, jadeite, garnet, and other high pressure crystals. Further, apparatuses and methods which allow individual temperature control of crystalline seeds, each being located to provide optimal growth conditions, are described herein.

In accordance with the present invention, a high pressure system can include at least one high pressure apparatus. The high pressure apparatus can include a plurality of pressure members which form a high pressure volume. Additionally, the high pressure apparatus includes at least one high pressure reaction assembly which can be placed in the high pressure volume. The reaction assembly can include a catalyst layer, at least one crystalline seed, and a raw material layer to form at least one growth cell. Typically, the crystalline seed and raw material can be separated by catalyst material such that a temperature gradient can be maintained within the growth cell. The raw material layer can be configured to allow raw material to diffuse into the catalyst layer along a bulk raw material diffusion direction. Further, the reaction assembly can be oriented substantially perpendicular to gravity during application of high pressure. Orienting the reaction assembly in this manner can avoid detrimental effects of gravity on the molten catalyst, e.g., convection, hence increasing available volumes for growing high quality crystals.

In another aspect of the present invention, the reaction assembly can include a plurality of growth cells. The plurality of growth cells can share a common raw material layer. Further, each growth cell can have bulk raw material diffusion directions substantially perpendicular to gravity and substantially collinear with one another.

In another aspect of the present invention, a plurality of reaction assemblies can be oriented in series within the high pressure volume.

In yet another aspect of the present invention, the high pressure systems can include a plurality of high pressure apparatuses oriented in series or in parallel. High pressures can be achieved using a variety of devices such as split die devices, piston-cylinder presses, girdle devices, belt devices, tetrahedral presses, cubic presses, toroidal devices, and the like. In one preferred embodiment, the pressure can be achieved using a split die device.

In still another aspect, a plurality of split die devices can be oriented in series and share at least one common anvil. Similarly, a plurality of split die devices can be oriented in parallel such that the split die devices share common force members.

In another aspect of the present invention, crystalline bodies can be grown at high pressures using the high pressure systems described herein. Optionally, the high pressure apparatus can be oriented such that said chamber axis is substantially perpendicular to gravity. A high pressure reaction assembly can be placed at least partially within the high pressure volume such that the assembly axis is oriented substantially perpendicular to gravity. A pressing force can then be applied to the reaction assembly substantially along the chamber axis which is sufficient to provide high pressures within the reaction assembly.

In a detailed aspect of the present invention, the growth cells can be configured for high pressure growth of crystalline bodies such as diamond, cBN, or other high pressure materials.

In yet another detailed aspect, temperature profiles within the plurality of growth cells can be actively controlled such that each crystalline seed has a lower temperature than a corresponding raw material. In order to facilitate active control of temperature profiles within the growth cell, heating and cooling elements can be placed in thermal contact with either the raw material layers and/or crystalline seeds.

In still another detailed aspect, the active control of temperature profiles and reaction assemblies of the present invention enable improved growth conditions for high quality crystals. As such, the apparatuses and methods of the present invention allow growth of gem quality diamonds with high quality and improved production capacities. The gem quality diamonds can have a size of from about 0.25 carat to about 25 carats, depending on specific materials and growth conditions, e.g., cycle time.

There has thus been outlined, rather broadly, various features of the invention so that the detailed description thereof that follows may be better understood, and so that the present contribution to the art may be better appreciated.

Other features and advantages of the present invention will be apparent from the following detailed description of the invention and corresponding drawings, taken with the accompanying claims, or may be learned by the practice of the invention.

Figure 1:
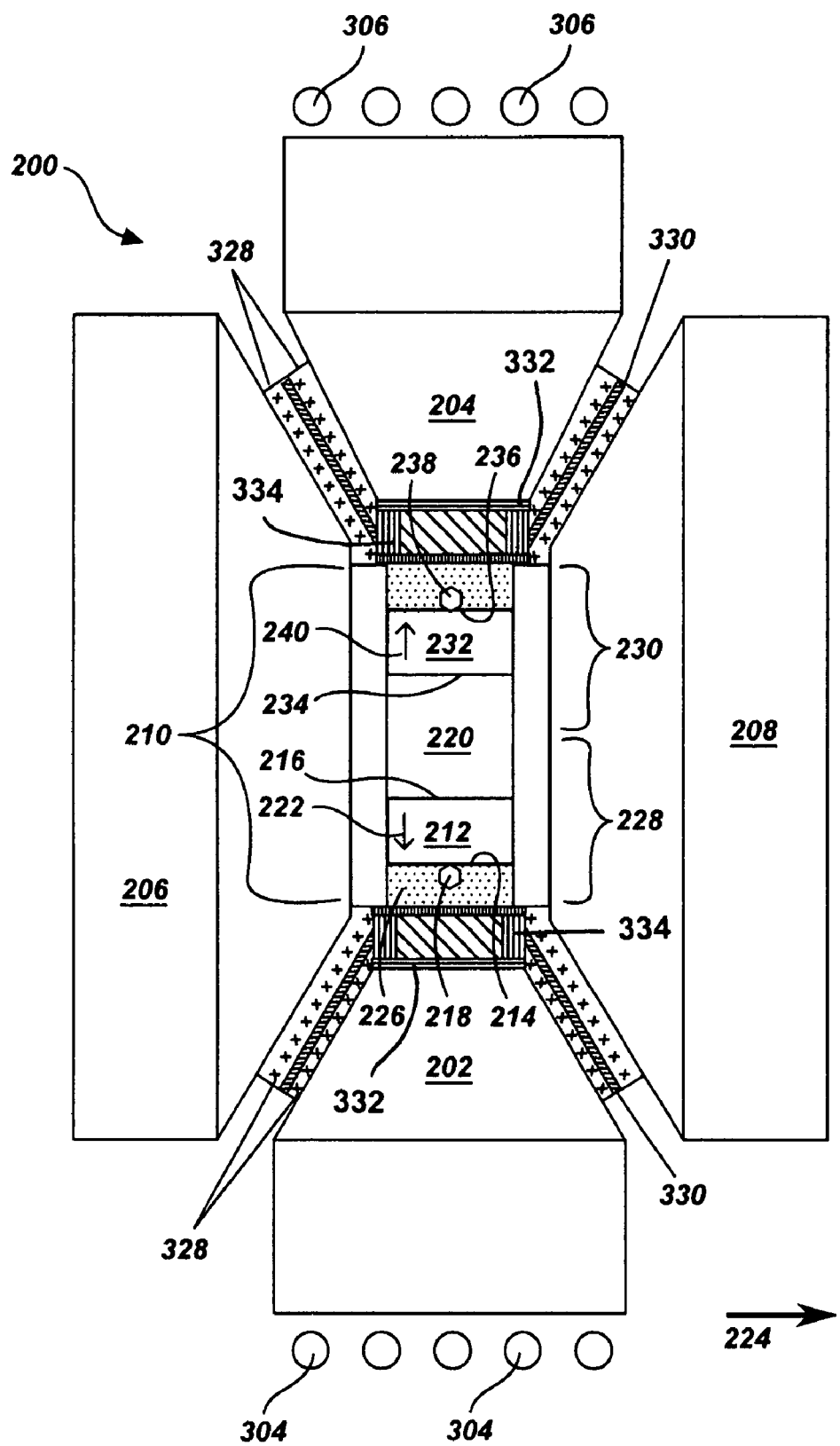
FIG. 1 is a cross-sectional view of a high pressure system in accordance with an embodiment of the present invention having two growth cells and a single reaction assembly.

The above figures are provided for illustrative purposes only and are not always drafted to scale. As such, variations may be had as to dimensions and proportions illustrated without departing from the scope of the present invention.

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features, process steps, and materials illustrated herein, and additional applications of the principles of the inventions as illustrated herein, which would occur to one skilled in the relevant art and having possession of this disclosure, are to be considered within the scope of the invention. It should also be understood that terminology employed herein is used for the purpose of describing particular embodiments only and is not intended to be limiting.

A. Definitions

In describing and claiming the present invention, the following terminology will be used.

The singular forms "a," "an," and "the" include plural referents unless the context clearly dictates otherwise. Thus, for example, reference to "a crystalline seed" includes reference to one or more of such materials, and reference to "a high pressure apparatus" includes reference to one or more of such devices.

As used herein, "anvil" refers to any solid mass capable of at least partially entering the die chamber sufficient to increase pressure within the reaction volume. Those skilled in the art will recognize various shapes and materials used for such anvils. Typically, the anvils have a frustoconical shape.

As used herein, "complementary" when used with respect to die segments, refers to parts which fit together to form a specified reaction volume configuration. The die segments "complement" each other by being shaped and configured to be held together under high pressures with minimal or no space between contact surfaces and to form an open die chamber. Frequently, complementary die segments can be configured to allow placement of a gasket or other material between contact surfaces to improve sealing of the reaction volume. Thus, complementary die segments need not be, and typically are not, in direct physical contact and can include intervening materials.

As used herein, "discrete force" refers to a force vector, which has an identifiable source and is associated with a single force vector, as opposed to a summation of somewhat random forces acting on a body, e.g., a gas or liquid surrounding a body.

As used herein, "high pressure volume" and "reaction volume" can be used interchangeably and refer to at least a portion of the die chamber in which conditions can be maintained at a high pressure sufficient for useful testing and/or growth of materials which are placed therein, e.g. usually the reaction volume can include a charge of raw material, i.e. nutrient source material, and catalyst materials for synthesis and growth of crystalline bodies. The reaction volume can be formed within a high pressure assembly placed at least partially within the die chamber.

As used herein, "high pressure assembly" and "reaction assembly" can be used interchangeably and refer to an assembly of materials which are to be subjected to high pressure. Most often, these materials can be placed in the reaction volume at least partially surrounded by a pressure medium and/or gasket assembly. However, those skilled in the art will recognize that the high pressure assembly can be formed of almost any material which can then be subjected to high pressure for such purposes as chemical reactions, crystalline growth, high pressure property measurements, and the like. A wide variety of high pressure assemblies are known and can be used in the present invention. Such high pressure assemblies can also include inert gaskets, separators, or other materials which improve HPHT conditions.

As used herein, "high pressure" refers to pressures above about 1 MPa and preferably above about 200 MPa.

As used herein, "ultrahigh pressure" refers to pressures from about 1 GPa to about 15 GPa, and preferably from about 4 GPa to about 7 GPa.

As used herein, "alloy" refers to a solid solution or liquid mixture of a metal with a second material, said second material may be a non-metal, such as carbon, a metal, or an alloy which enhances or improves the properties of the metal.

As used herein, "seeds" refer to particles of either natural or synthetic diamond, super hard crystalline, or polycrystalline substance, or mixture of substances and include but are not limited to diamond, polycrystalline diamond (PCD), cubic boron nitride, SiC, and the like. Crystalline seeds can be used as a starting material for growing larger crystals and help to avoid random nucleation and growth of crystal.

As used herein, "growth cell" refers to an assembly of crystalline seed and raw material separated by a catalyst layer. In context of the present invention, this typically refers to a growth cell configured for temperature gradient controlled growth; however growth cells configured for isothermal growth or other crystal growth methods can also be used.

As used herein, "raw material" refers to materials used to form a crystal. Specifically, raw material is a source of material which provides a nutrient for growth of a crystal, e.g., carbon, hBN, etc.

As used herein, "superabrasive" refers to particles of diamond or cBN, including sintered polycrystalline forms of diamond and cBN.

As used herein, "precursor" refers to an assembly of crystalline seeds, catalyst material, and a raw material. A precursor describes such an assembly prior to the crystalline or diamond growth process, i.e. a "green body."

As used herein, "inclusion" refers to entrapment of non-diamond material within a growing crystal. Frequently, the inclusion is a catalyst metal enclosed within the crystal under rapid growth conditions. Alternatively, inclusions can be the result carbon deposits forming instead of diamond at the interface between a crystal growth surface of the diamond and the surrounding material. In general, inclusions are most often formed by the presence of substantial amounts of carbon at the growth surface of the diamond and/or inadequate control of temperature and pressure conditions during HPHT growth.

As used herein, "euhedral" means idiomorphic, or having an unaltered natural shape containing natural crystallographic faces resulting from unimpeded growth of crystal planes.

As used herein, "contacting" refers to physical intimate contact between two materials. For example, a crystalline seed can be placed "contacting" a catalyst layer. As such, the crystalline seed can be in contact with a surface of the catalyst layer, partially embedded therein, or fully embedded in the catalyst layer.

As used herein, "thermal contact" refers to proximity between materials which allows for thermal transfer from one material to another. Therefore, thermal contact does not require that two materials be in direct physical contact. Materials can be chosen having various thermal conductivities so as to enhance or hinder thermal contact between materials as desired.

As used herein, "bulk" refers to an average or collective property. For example, a bulk diffusion direction would indicate the average direction of diffusion of a dissolved material despite local fluctuations in diffusion directions and/or diffusion rates of individual atoms.

As used herein, "chamber axis" refers to an axis which is substantially along the center of an open space of the die chamber and is often parallel to the bulk diffusion direction or temperature gradient in which raw material diffuses during crystal growth under thick film process conditions.

As used herein, "gem quality" refers to crystals having no visible irregularities (e.g., inclusions, defects, etc.) when observed by the unaided eye. Crystals grown in accordance with the present invention exhibit a comparable gem quality to that of natural crystals which are suitable for use in jewelry.

As used herein, "substantially free of" or the like refers to the lack of an identified element or agent in a composition. Particularly, elements that are identified as being "substantially free of" are either completely absent from the composition, or are included only in amounts which are small enough so as to have no measurable effect on the composition.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited.

For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

B. The Invention

Reference will now be made to the drawings in which the various elements of the present invention will be given numeral designations and in which the invention will be discussed. It is to be understood that the following description is only exemplary of the principles of the present invention, and should not be viewed as narrowing the appended claims.

Referring now to FIG. 1, a high pressure apparatus is shown generally at 200 having a plurality of pressure members 202, 204, 206, and 208. FIG. 1 illustrates a girdle-type high pressure split die apparatus, although any high pressure device capable of reaching pressures and temperatures described herein can be used. Such devices are described in more detail in conjunction with one alternative embodiment below. The high pressure apparatus can be configured to form a high pressure volume.

A high pressure reaction assembly 210 can be configured for placement in the high pressure volume. The reaction assembly can typically include materials for growing a crystalline body from a crystalline seed. In one aspect, materials suitable for a reaction assembly can include at least one crystalline seed, a catalyst layer, and a raw material layer. The materials can be configured for temperature gradient controlled crystal growth. As such, the crystalline seed can be separated from the raw material layer by the catalyst layer to form a growth cell.

In the embodiment of FIG. 1, the reaction assembly 210 includes a first catalyst layer 212 having a crystal growth surface 214 and a raw material flux surface 216. The catalyst layer can be formed of any suitable catalyst material, depending on the desired grown crystal. Catalyst materials suitable for diamond synthesis can include metal catalyst powder, solid layers, or solid plates comprising any metal or alloy which includes a carbon solvent capable of promoting growth of diamond from carbon source materials. Non-limiting examples of suitable metal catalyst materials can include Fe, Ni, Co, Mn, Cr, and alloys thereof. Several common metal catalyst alloys can include Fe—Ni, e.g., INVAR alloys, Fe—Co, Ni—Mn—Co, and the like. Currently preferred metal catalyst materials are Fe—Ni alloys, such as Fe—35Ni, Fe—31Ni—5Co, Fe—50Ni, and other INVAR alloys, with Fe—35Ni being the most preferred and readily available. Alternatively, catalyst layers can be formed by stacking layers of different materials together to produce a multi-layered catalyst layer or providing regions of different materials within the catalyst layer. For example, nickel and iron plates or compacted powders can be layered to form a multi-layered Fe—Ni catalyst layer. Such a multi-layered catalyst layer can reduce costs and/or be used to control growth conditions by slowing or enhancing initial growth rates at a given temperature. In addition, the catalyst materials under diamond synthesis can include additives which control the growth rate and/or impurity levels of diamond, i.e. via suppressing carbon diffusion, prevent excess nitrogen and/or oxygen from diffusing into the diamond, or effect crystal color. Suitable additives can include Mg, Ca, Si, Mo, Zr, Ti, V, Nb, Zn, Y, W, Cu, Al, Au, Ag, Pb, B, Ge, In, Sm, and compounds of these materials with C and B.

Similarly, catalyst materials suitable for cBN synthesis can include any catalyst capable of promoting growth of cBN from suitable boron nitride raw materials. Non-limiting examples of suitable catalyst materials for cBN growth include alkali metals, alkaline earth metals, and compounds thereof. Several specific examples of such catalyst materials can include lithium, calcium, magnesium, nitrides of alkali and alkaline earth metals such as $Li_3N$, $Ca_3N_2$, $Mg_3N_2$, $CaBN_2$, and $Li_3BN_2$. The catalyst materials under cBN synthesis can further include very minor amounts of additives which control the growth rate or interior color of cBN crystal such as Si, Mo, Zr, Ti, Al, Pt, Pb, Sn, B, C, and compounds of these materials with Si, B, and N.

The catalyst layer 212 can be any suitable dimension which allows for diffusion of raw materials into the catalyst layer and maintenance of a temperature gradient. Typically, the catalyst layer can be from about 1 mm to about 20 mm in thickness. However, thicknesses outside this range can be used depending on the desired growth rate, magnitude of temperature gradient, and the like.

At least one crystalline seed 218 can contact the catalyst layer 212. Crystalline seeds can be placed contacting the crystal growth surface 214 of the catalyst layer from a position external to the catalyst layer, e.g., as shown in FIG. 1. Alternatively, the crystalline seeds can be placed partially or wholly within the catalyst layer. The number of crystalline seeds contacting the catalyst layer can vary from one to any practical number. Of course, the number of crystalline seeds contacting a catalyst layer can be a function of available area, crystalline seed size, final desired crystal size, and radial temperature gradients, i.e. perpendicular to the bulk diffusion direction discussed below. In one specific embodiment, a single crystalline particle can contact the catalyst layer of each growth cell.

The crystalline seeds can be any suitable seed material upon which growth can occur for either diamond or cBN. In one aspect of the present invention, the crystalline seeds can be diamond seeds, cBN seeds, or SiC seeds. The synthesis of either diamond or cBN can utilize any of the listed crystalline seeds which have similar crystal structures. Frequently, diamonds seeds are the preferred crystalline seeds for diamond synthesis, although cBN or SiC seeds can also be used. Similarly, in some embodiments of cBN synthesis, cBN seeds can be used, although diamond or SiC seeds can also be used. Alternatively, the crystalline seeds can be polycrystalline or multi-grained such that a plurality of smaller crystals are bonded together to form each crystalline seed.

Typically, the crystalline seeds can have a diameter of from about 30 μm to about 1 mm, and preferably from about 50 μm to about 500 μm. However, the present invention can be used in growth of almost any size crystalline seed. Allowing for larger crystalline seeds also reduces the growth time required to produce large gem quality crystals. In particular, diamond seeds suitable for use in the present invention can be larger than typical diamond seeds, i.e. from about 200 μm to about 500 μm, although the above ranges can also be effectively used. However, in some embodiments a smaller diamond seed may be desirable. Specifically, a final crystal grown from a relatively large crystalline seed can exhibit a discernable interface between the original crystalline seed and the grown crystal volume. Conversely, a smaller crystalline seed can result in a final crystal which has an obscured or substantially eliminated interface between the original crystalline seed and grown crystal.

In one alternative embodiment, the crystalline seed and catalyst layer can be separated by a partition layer. Under some circumstance, especially during early stages of crystal synthesis, a nutrient deficient molten catalyst layer may completely dissolve the crystalline seed before the catalyst layer is sufficiently saturated with nutrient, i.e. raw material, to begin growth of the crystal. In order to reduce or prevent excessive dissolution of the crystalline seed(s), particularly for small seeds, a thin partition layer can be placed between the crystalline seed and the catalyst material. For example, the partition layer can be in the form of a coating around the crystalline seed or may be a layer along the growth surface which provides a temporary barrier to catalyst material. The partition layer can be formed of any material, metal, or alloy having a melting point higher than the melting point of the catalyst material. One exemplary partition layer material includes platinum. Thus, the partition layer can preserve the crystalline seed until the catalyst layer is saturated (or substantially saturated) with nutrient material. The partition layer can be adjusted in thickness and composition to allow the partition layer to be substantially removed, i.e. dissolved or otherwise rendered a non-barrier, such that growth of the crystalline seed can occur once sufficient nutrient material is dissolved in the catalyst layer.

In an optional embodiment, a support layer 226 can be placed in contact with the crystal growth surface 214 of the catalyst layer 212. The support layer can be formed of any material which does not interfere with growth of the crystalline bodies. In some cases, the support layer can allow raw material to diffuse thereinto. Non-limiting examples of material suitable for support layers include NaCl, dolomite, talc, pyrophillite, metal oxides, and the like. In embodiments where the crystalline seed 218 contacts the growth surface, the support layer can at least partially surround the crystalline seed.

A raw material layer 220 can be adjacent the raw material flux surface 216 of the first catalyst layer 212. The raw material layer can be configured to provide a source of raw material for growth of a desired crystalline body such as diamond or cBN from a crystalline seed. Specifically, a carbon source can be used as the raw material for diamond growth, while a low pressure phase boron nitride such as hBN (white graphite) or pyrolitic boron nitride (pBN) can be used as the raw material for cBN growth. Under diamond growth conditions, the carbon source layer can comprise a carbon source material such as graphite, amorphous carbon, diamond powder, and the like. In one aspect of the present invention, the carbon source layer can comprise high purity graphite. Although a variety of carbon source materials can be used, graphite generally provides good crystal growth and improves homogeneity of the grown diamonds. Further, low resistivity graphite also provides a carbon source material which can also be readily converted to diamond. However, consideration should be given to the volume reduction associated with conversion of graphite to diamond, i.e. design of a high pressure apparatus capable of compensating for the volume reduction. For example, stiffening of the gasket material and increase in internal friction forces tends to limit the degree to which an apparatus can compensate for volume reductions. Thus, some pressure decay is typically encountered. In order to minimize this effect, diamond powder can be used as a raw material, thereby increasing the time at which optimal pressure conditions can be maintained.

When using graphite as a carbon source, the pressure may decay as a result of volume reduction as the graphite is converted to diamond. One optional way to reduce this problem is to design the die chamber and corresponding anvils such that the anvils can continue to advance to compensate for the volume reduction and maintain a desired pressure, e.g., form a steeper throat angle in entrances to the die chamber. For example, compare FIG. 1 having a steeper throat angle to FIG. 4 having a shallow throat angle. As mentioned above, despite higher costs, using diamond powder as a raw material can also reduce the degree of volume reduction and further provides a high purity carbon source.

The high pressure reaction assemblies of the present invention can be assembled having a plurality of crystalline growth cells aligned substantially along an assembly axis. Each growth cell can include a crystalline seed, a catalyst layer, and a raw material layer. The high pressure reaction assembly can be placed at least partially within the high pressure volume such that the assembly axis is oriented substantially perpendicular to gravity, i.e. and usually substantially parallel to the chamber axis. Alternatively, the chamber axis can be substantially parallel to gravity and substantially perpendicular to the assembly axis.

The raw material layer 220 can be configured to allow raw material to diffuse into the catalyst layer 212 along a bulk raw material diffusion direction 222. The bulk raw material diffusion direction can be oriented substantially perpendicular to gravity 224 during application of high pressure. Orienting the reaction assembly in this manner substantially eliminates gravity effects within the reaction assembly which results in upper portions of typical vertical reaction assemblies producing poor quality crystals. Specifically, when the bulk diffusion direction is horizontal, diffusion of raw material is increased by convection flow of molten catalyst. The rapid rising of heated raw material accelerates growth of the crystals at the upper portions sufficiently to entrap catalyst metal and form other inclusions resulting in a poor quality crystal. Typically, diffusion of raw material is toward the growth surface 214, although the rate and direction of diffusion can be affected by a variety of variables such as temperature, catalyst purities, catalyst layer density, growth of crystalline seed (which can disturb local flux of raw material), and the like. In one preferred aspect, the reaction assembly can be configured for temperature gradient controlled growth.

The high pressure apparatuses of the present invention can further include additional materials such as gaskets, separators, and the like. For example, FIG. 1 shows gaskets 328 which fill spaces between the die segments and anvils. Optionally, a metal cone 330 can be placed between gasket layers in order to help maintain a pressure gradient across the gasket region when using a relatively thick gasket. Further, a thicker gasket can allow for a larger anvil stroke to compensate for pressure decay during crystal growth. Additional metal cones can be included in concentric layers of metal and gasket material, depending on expected volume reduction and the design of the reaction cell. Optional copper shims 332 can be used to reduce stress at the anvil 202 and 204 surfaces, while also preventing corrosion due to volatiles driven out of the gasket materials. A steel ring 334 can be placed at each end of the reaction assembly 210 in order to transmit electrical current to a graphite heating tube, if used. Red salt (cuprous cupric salt) containing dispersed iron oxide can be used which slows heat transfer. Alternatively, zirconia or other materials can be added as further insulation. High resistivity graphite can also be used as a heating element via resistive heating.

In an additional aspect of the present invention, the reaction assembly can include a plurality of growth cells. Additional growth cells can share common raw material layers and/or common support layers. For example, FIG. 1 illustrates a reaction assembly 210 having two growth cells 228 and 230. Growth cell 230 can include a second catalyst layer 232 having a growth surface 236 and a raw material flux surface 234. At least one crystalline seed 238 can be placed contacting the second catalyst layer. The raw material flux surface 234 can be adjacent the raw material layer 220 opposite the first catalyst layer 212. As such, a portion of the raw material will diffuse into the second catalyst layer along a second bulk raw material diffusion direction 240.

Figure 2:
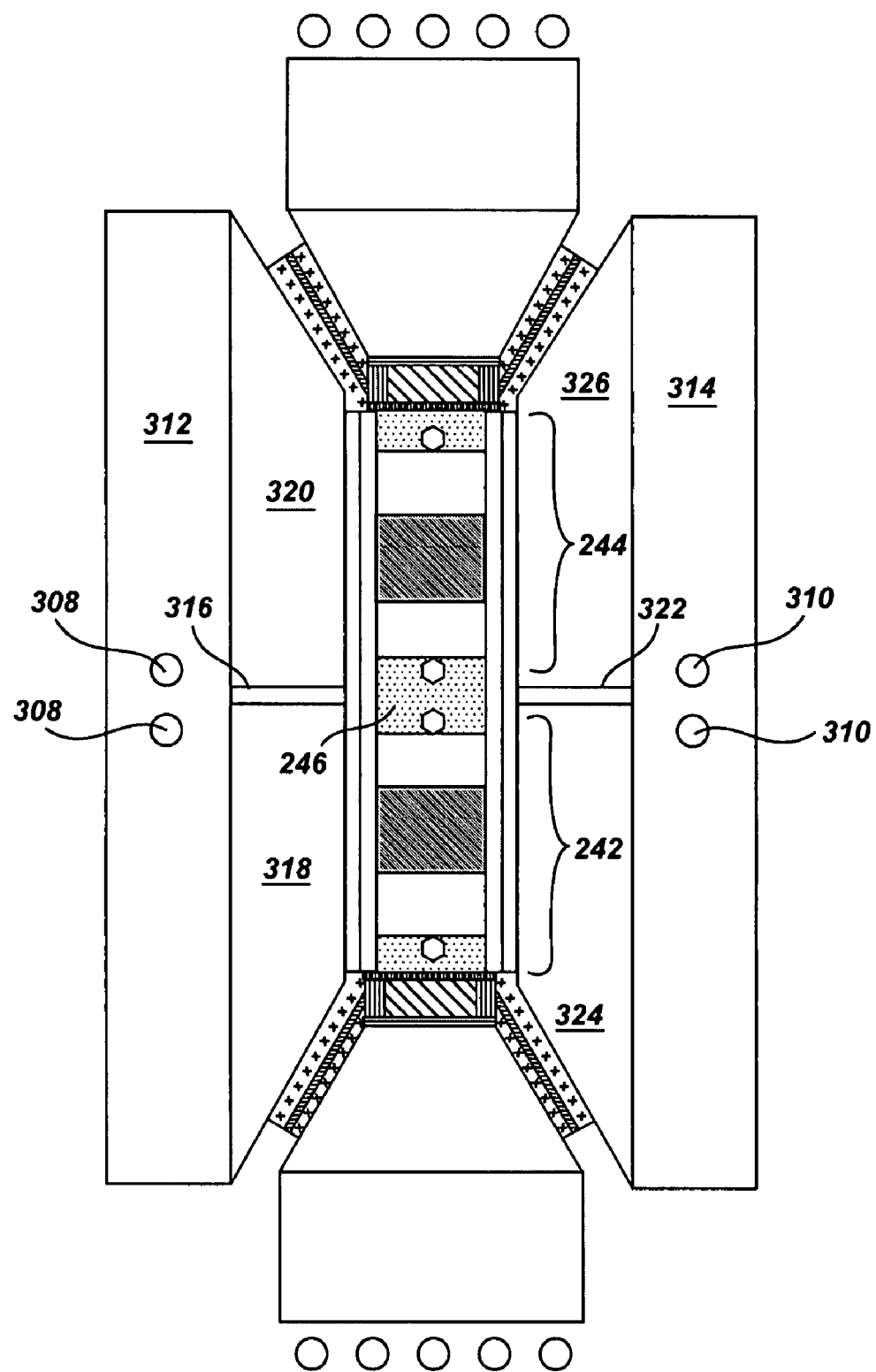
FIG. 2 is a cross-sectional view of a high pressure system in accordance with an embodiment of the present invention having four growth cells and two reaction assemblies in series.

In an alternative embodiment of the present invention a plurality of reaction assemblies can be placed within the high pressure volume. Typically, the reaction assemblies can be oriented in series such that the bulk diffusion directions of each growth cell are substantially parallel to each other and to the chamber axis. Further, the reaction assemblies can share common layers such as a support layer or can be separated by a barrier layer. FIG. 2 illustrates an embodiment having two reaction assemblies 242 and 244. The reaction assemblies are adjacent one another in a series configuration and share a common support layer 246.

Figure 3:
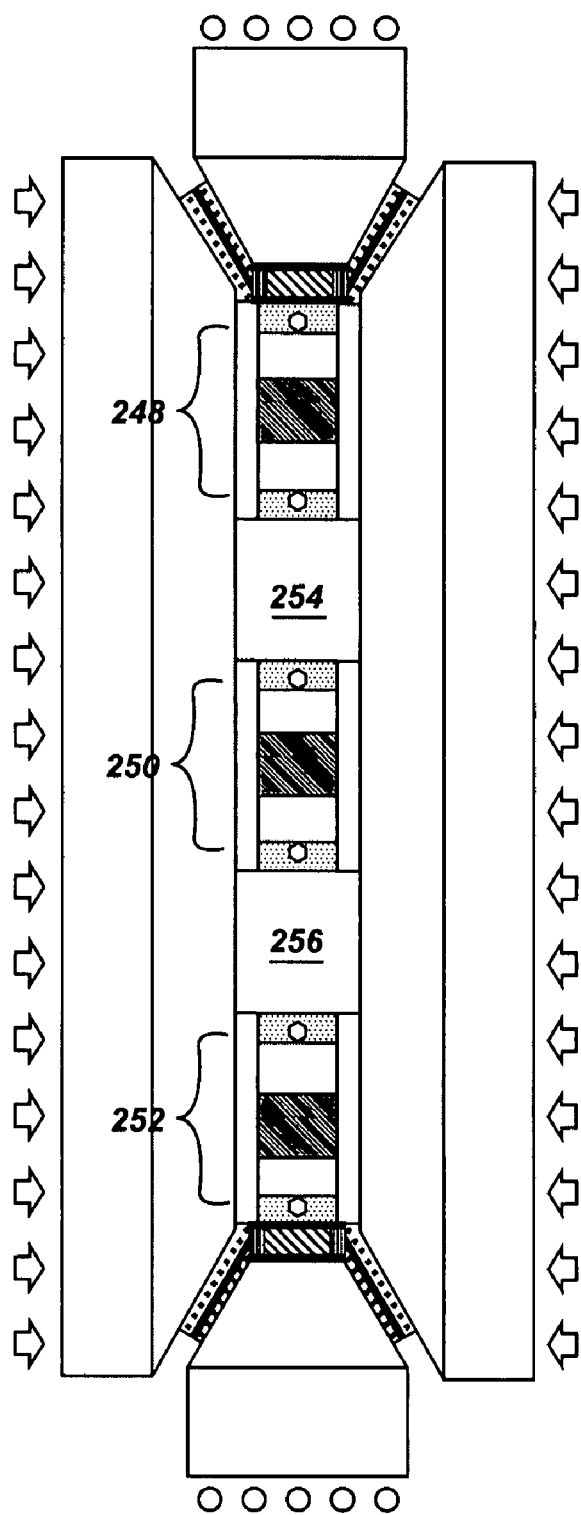
FIG. 3 is a cross-sectional view of a high pressure system in accordance with another embodiment of the present invention having six growth cells and three reaction assemblies in series.

Alternatively, or in conjunction with the embodiment of FIG. 2, a plurality of reaction assemblies can be oriented in series within the high pressure volume having a barrier layer between reaction assemblies. FIG. 3 illustrates an embodiment having three reaction assemblies 248, 250 and 252 separated by barrier layers 254 and 256. The barrier layer can be any material which is suitable for high pressure applications and which does not interfere with crystal growth, e.g., steel plates, dolomite, or the like. The barrier layers can be allowed to shift slightly along the chamber axis during growth as the anvils advance, in order to compensate for any volume reduction which occurs.

Any additional growth cells (whether in the same or separate reaction assemblies) can have substantially identical temperature gradients and materials such that grown crystals have substantially the same growth rates and quality, i.e. diffusion rates of raw material in each growth cell is substantially the same. Alternatively, each growth cell can have distinct materials, e.g., cBN and diamond and/or differing temperature gradients which result in differing growth rates.

In accordance with another aspect of the present invention, the plurality of pressure members can be provided by any number of high pressure devices. Several non-limiting examples of suitable high pressure devices can include split die devices, piston-cylinder presses, girdle devices, belt devices, tetrahedral presses, cubic presses, and toroidal devices. Belt apparatuses can have curved frustoconical anvils with corresponding curved die bores similar to that shown in FIG. 4. Likewise, girdle-type devices are similar to belt devices; however the anvils are flat surfaced frustoconical with corresponding die chambers having flat tapers such as that shown in FIG. 1. In one currently preferred embodiment, the pressure members are provided by a split die device as described below.

In accordance with the present invention, a high pressure split die device can include a plurality of complementary die segments. The die segments of the present invention can be assembled to form a die chamber. The die chamber can be at least partially filled with a high pressure assembly containing materials to be subjected to high pressures. A pair of anvils can be oriented such that an anvil is at each end of the die chamber. The anvils can then be moved towards each other to compress the high pressure assembly and apply force thereto. Additionally, a plurality of force members can be operatively connected to the plurality of die segments to retain the die segments in substantially fixed positions relative to each other during application of force by the pair of anvils. One advantage to this configuration is that the die segments do not experience the same hoop tension around the die circumference as a standard single piece belt die.

Figure 4:
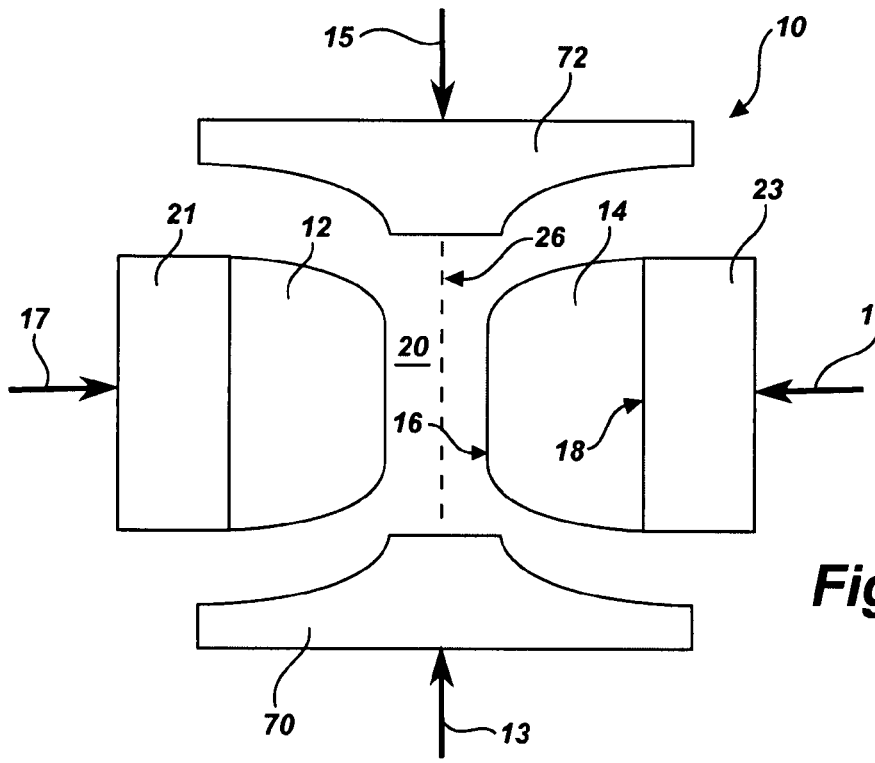
FIG. 4 is a cross-sectional view of a high pressure split die apparatus in accordance with an embodiment of the present invention.

Referring now to FIG. 4, a high pressure split die device, shown generally at 10, can include a plurality of complementary die segments 12 and 14. Each die segment can have an inner surface 16 and an outer surface 18. The die segments can be configured to be assembled to form a die having a die chamber 20 capable of holding a high pressure assembly, such as the reaction assemblies described above. The die chamber 20 can have a chamber axis 26 substantially along the center of the die chamber.

Figure 5A:
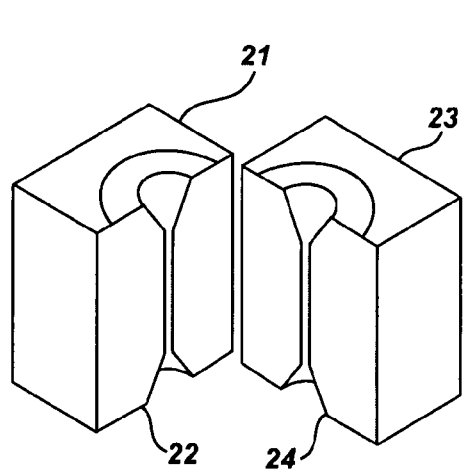
FIG. 5A is a perspective view of two die segments and corresponding support members in accordance with an embodiment of the present invention.
Figure 7A:
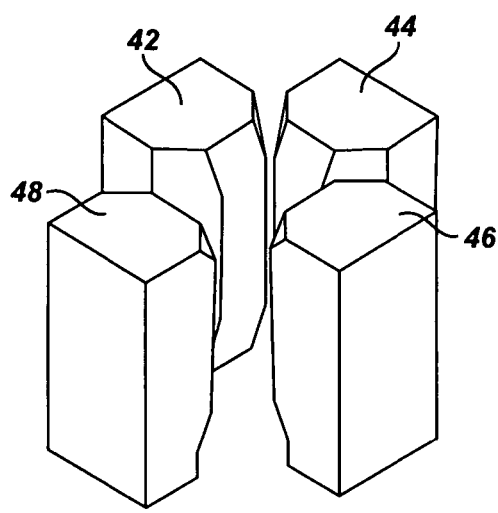
FIG. 7A is a perspective view of four die segments in accordance with an embodiment of the present invention.

The die chamber 20 can be formed in a wide variety of shapes. FIG. 4 illustrates a die chamber having a cylindrical portion having ends which are tapered outward. The tapered portions are shown as tapering gradually to form a curved surface outward; however, the tapered portions can also be flat as shown in FIGS. 1, 5A and 7A. Alternatively, the die chamber can also be a straight cylinder without a tapered portion. Of course, the die chamber can also have a shape which does not have a cylindrical portion, wherein the tapered portions at either end comprise the entire die chamber volume similar to a typical belt die. Typically, in this embodiment, the die chamber has a length which is from about 0.5 to about 10 times the minimum chamber diameter. Regardless of the die chamber configuration, the die chamber can have a length of from about 0.5 to about 15 times the minimum chamber diameter. In some embodiments, the die chamber can have a length of from about 1 to about 10 times the minimum chamber diameter. More specifically, in embodiments having multiple growth cells and/or reaction assemblies, the length can be greater and in some embodiments can vary from about 2 to about 10 times the minimum chamber diameter or from about 3 to about 10 times. In an additional aspect of the present invention, the die chamber can have a reaction volume from about 1 cm$^3$ to about 1000 cm$^3$, and preferably from about 5 cm$^3$ to about 500 cm$^3$.

Other die chamber configurations can also be used and are considered within the scope of the present invention. In one aspect, the die chamber can have an interior surface which is substantially continuous such that when the die segments are assembled, a single chamber extends through the assembled die segments. Preferably, the die segments can be shaped such that adjacent surfaces are flush and have substantially no space between them when assembled, typically with corresponding gaskets.

The inner surfaces of the plurality of die segments can be configured to form a die chamber having a predetermined cross-section. Specifically, the inner surfaces can be, but are not limited to, arcuate, flat, or contoured surfaces. For example, when assembled, arcuate inner surfaces can form a die chamber having a circular cross-section. Similarly, when assembled, flat inner surfaces can form a die chamber having triangle, square, pentagon, and the like cross-sections, depending on the number of die segments.

In accordance with the present invention, the number of complementary die segments can vary from two to any practical number. In one aspect, the high pressure apparatus of the present invention can include from two to ten complementary die segments. As the number of die segments increases, the relative size of each segment decreases. As a result, each die segment can be sintered having a higher degree of homogeneity and fewer localized structural weaknesses than a single piece die or larger die segments. However, a greater number of die segments can also increase complexity and maintenance costs of the apparatus, as described in more detail below in connection with increased numbers and complexity of support members and presses. Typically, the number of die segments can be from two to four. In one detailed aspect, the high pressure apparatus can include two complementary die segments. In another detailed aspect, the high pressure apparatus can include four complementary die segments.

The die segments can be formed of any hard material having a high compressive strength. Examples of suitable hard material for forming die segments of the present invention can include, but are not limited to, cemented tungsten carbide, alumina, silicon nitride, zirconium dioxide, hardened steel, super alloys, i.e. cobalt, nickel and iron-based alloys, and the like. In a preferred embodiment, the die segments can be formed of cemented tungsten carbide. Preferred cemented tungsten carbides can be formed of submicron tungsten carbide particles and include a cobalt content of about 6 wt %. Those of ordinary skill in the art will recognize other materials that may be particularly suited to such high pressure devices.

Referring again to FIG. 4, the outer surface 18 can be configured to attach to respective support members 21 and 23. The outer surface can be any configuration such as flat or contoured; however, typically the outer surface can be flat. Alternatively, the outer surface can have a convex contour which transfers a portion of the applied stress toward a center portion of the outer surface and reduce tensile stress along the exterior of the die segments 12 and 14. The support members are optional in the high pressure apparatus of the present invention. However, it is often preferable to provide support members to protect and reinforce the more expensive die segments. Typically, each die segment can have a corresponding support member. Alternatively, two or more die segments can be attached to a single support member. The support members can be formed of any hard material. Non-limiting examples of suitable hard materials include steel, hardened steel, metal carbides, ceramics, and alloys or composites thereof. Typically, the support members can be hardened steel. The die segments 12 and 14 of FIG. 4 can be retained in substantially fixed positions relative to each other via discrete forces 17 and 19. Most often, the die segments and support members can be separated by a thin gasket material, e.g., pyrophillite or talc. The gasket material can provide improved sealing between surfaces and helps to avoid local pressure spikes due to direct contact of two hard materials.

FIGS. 5A through 10 illustrate a few potential configurations for segmented dies of the present invention. FIG. 5A shows a set of two complementary die segments 22 and 24, each engaged with a separate support member 21 and 23, respectively. The die segments can be assembled as shown in FIG. 5B to form die chamber 20a. The die chamber shown in FIG. 5B has a cylindrical portion and flat tapered portions at each end of the cylindrical portion. Forces 27 and 29 can be applied to the support members to retain the die segments together. An optional gasket 25 can also be included between contacting surfaces of the die segments and support members. The gasket can provide a seal between surfaces, as well as to electrically and/or thermally insulate. Typically, the gasket can be formed of known materials such as, but not limited to, talc, pyrophillite, and the like. Additional materials such as quartz and zirconia can be added to adjust various mechanical and/or thermal properties of the gasket.

Figure 6A:
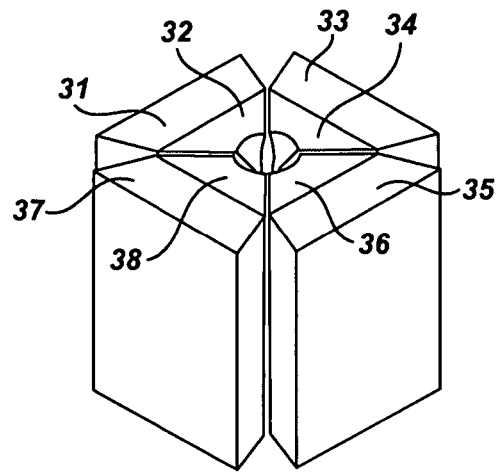
FIG. 6A is a perspective view of four die segments and corresponding support members in accordance with an embodiment of the present invention.
Figure 6B:
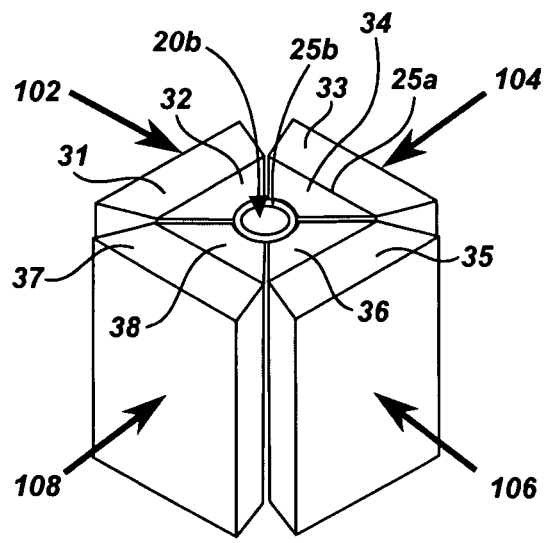
FIG. 6B is a perspective view of the die segments of FIG. 6A assembled to form a die chamber.

FIG. 6A shows a set of four complementary die segments 32, 34, 36, and 38, each engaged with a separate support member 31, 33, 35, and 37, respectively. The die segments can be assembled as shown in FIG. 6B to form die chamber 20b. The die chamber shown in FIG. 6B has a cylindrical portion and flat tapered portions at each end of the cylindrical portion. Forces can be applied to each of the four support members to retain the die segments together. An optional gasket 25a can also be included between contacting surfaces of the die segments and support members. Additionally, optional gasket 25b can be placed in the die chamber, as is well known in the art.

Figure 7B:
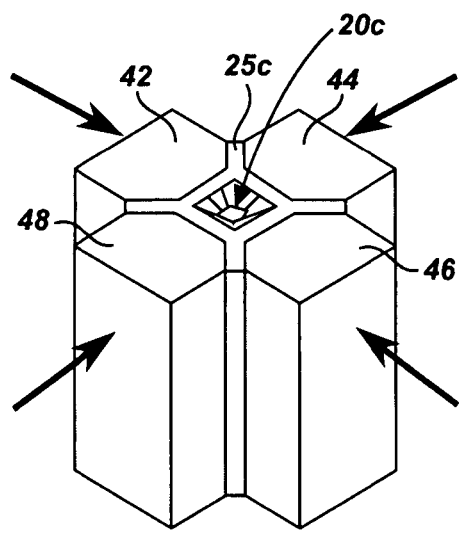
FIG. 7B is a perspective view of the die segments of FIG. 7A assembled to form a die chamber.

FIG. 7A shows a set of four complementary die segments 42, 44, 46, and 48 having no attached support members. As such, in some aspects of the present invention, the die segment may be used without a support member, or the die segment and support member can be a single integral piece. The die segments can be assembled as shown in FIG. 7B to form die chamber 20c. The die chamber shown in FIG. 7B has a rectangular volume and flat tapered portions at each end of the rectangular volume. Forces can be applied to each of the four die segments to bring them together, and retain them in place when the anvils are used to apply pressure along the chamber axis of the die chamber. An optional gasket 25c can also be included between contacting surfaces and between surfaces of the die chamber and the high pressure assembly.

Figure 8A:
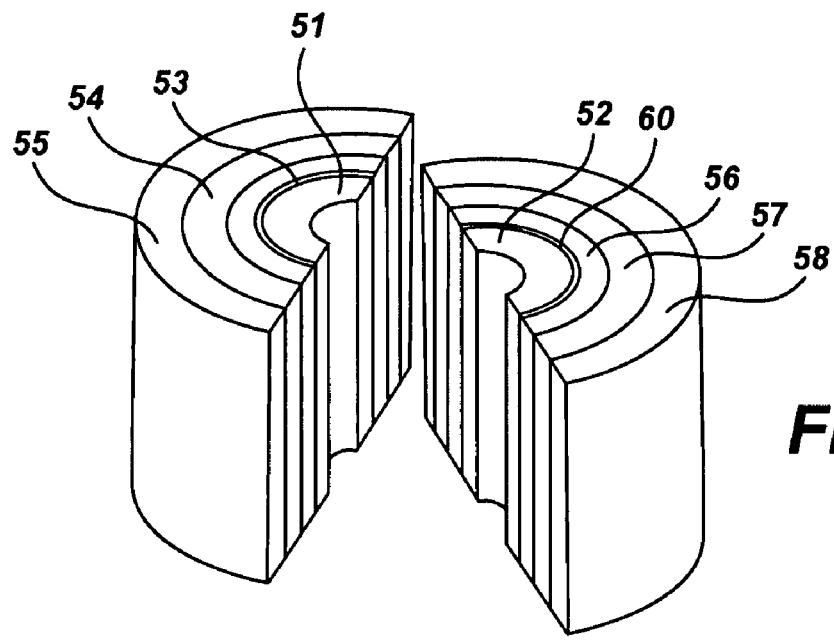
FIG. 8A is a perspective view of two die segments and corresponding support members in accordance with another embodiment of the present invention.
Figure 8B:
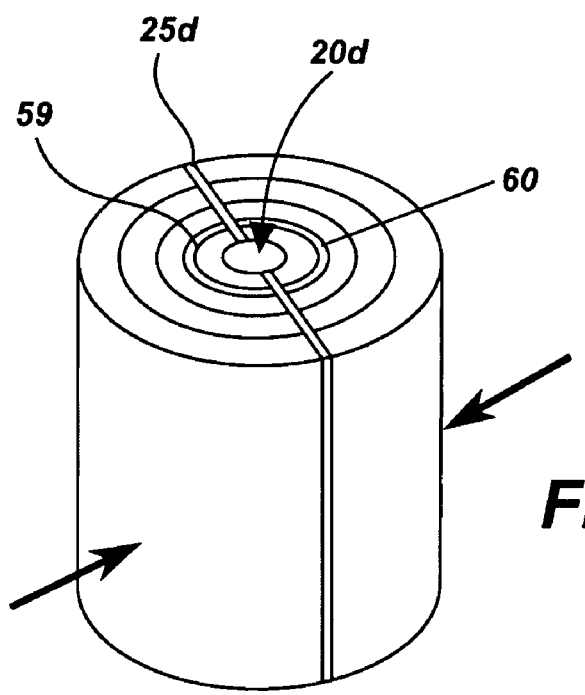
FIG. 8B is a perspective view of the die segments of FIG. 8A assembled to form a die chamber.

FIG. 8A shows a set of two complementary die segments 51 and 52, each surrounded by arcuate support members 53 through 58, respectively. The die segments can be assembled as shown in FIG. 8B to form die chamber 20d. The die chamber shown in FIG. 6B has a cylindrical portion and flat tapered portions at each end of the cylindrical portion having a smaller taper angle than that of FIG. 8A. Forces can be applied to each of the support members to retain the die segments together. An optional gasket 25*d* can also be included between contacting surfaces of the die segments and support members. Additionally, optional sleeves 59 and 60 can be placed between the die segments 51 and 52 and support members 53 and 56, respectively.

Similarly, a set of three complementary die segments can each be attached to a separate support member. The die segments can be assembled to form a die chamber. The die chamber can be shaped as in the configurations discussed herein. Forces can be applied to each of the three support members to retain the die segments together. An optional gasket can also be included between contacting surfaces of the die segments and support members. Additionally, an optional gasket can be placed in the die chamber, as is well known in the art.

Figure 9:
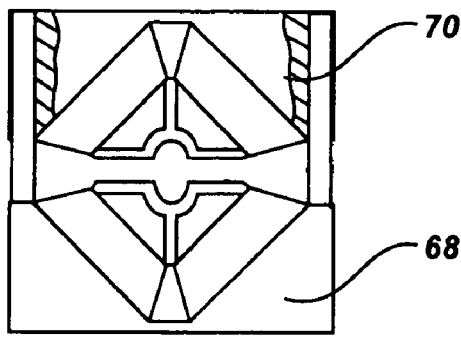
FIG. 9 is a side view of four die segments mounted on two support members in accordance with an embodiment of the present invention.

FIG. 9 illustrates the four die segments and corresponding support members of FIGS. 6A and 6B such that two die segments are attached to each of two secondary support members 68 and 70. Each of the support members have a slanted surface contacting the die segments such that the pressing force is substantially divided to form a pressing force against each die segment.

The above discussion has focused primarily on die segments wherein the die segments are split along surfaces which are substantially parallel to the chamber axis along the center of the die chamber. However, in an additional aspect of the present invention, the die segments can be split in almost any configuration. For example, the die segments can be split along a plane which is perpendicular to the chamber axis. FIG. 2 shows gasket 316 placed between die segments 318 and 320 and gasket 322 between die segments 324 and 326 having splits which are perpendicular to the chamber axis. In this case, the die segments are not firmly secured to the respective supporting members 312 and 314, and are allowed to shift slightly along the chamber axis as the anvils advance. Die segments which split the die chamber perpendicular to the chamber axis can allow for increased die chamber lengths and thus increased high pressure reaction volumes. Increased die chamber lengths allow for additional growth cells and/or reaction assemblies in accordance with several embodiments of the present invention. In addition, perpendicular splits can improve access to the reaction volume during assembly, cleaning of the device, or replacement of failed die segments. Further, the perpendicular split can also allow for convenient insertion of thermocouples for temperature monitoring. As mentioned above, partitioning of the split die also reduces die segment production costs by allowing for smaller sintering masses and reduced non-homogeneous sintering.

Referring again to FIG. 4, a pair of anvils 70 and 72 can be oriented such that an anvil is at each end of the die chamber 20. The anvils can be configured to apply pressing forces 13 and 15 substantially along the chamber axis through movement of the anvils towards one another to shorten the die volume. Most often, a high pressure assembly can be placed in the die chamber such that the reaction volume is subjected to high pressure during application of force from the anvils. High pressure assemblies can contain a material to be subjected to high pressure such as diamond seeds, graphite, catalysts, cBN seeds, hBN, and the like. Typically, the high pressure assembly can include metal braze coatings, gasket materials, graphite heating tubes, resistors, and the like. Those skilled in the art will recognize additional high pressure assembly compositions and configurations which are useful for reaction and or experimentation at high pressures.

Anvils 70 and 72 are shown as masses having frustoconical portions which are shaped to fit into the ends of the die chamber 20. In connection with the present invention, suitable anvil shapes can also include, without limitation, frustopyramidal, piston, and the like. For example, frustopyramidal anvils can be useful for use with die chambers such as die chamber 20*c* shown in FIG. 7B. Frustoconical portions can have flat surfaces (as in FIG. 4) or curved surfaces (as in FIG. 1). Anvils can be formed of any suitable hard material and is typically formed of cemented tungsten carbide, e.g., about 4% cobalt, although other materials can be used.

As the anvils advance, the materials placed in the die chamber have a tendency to expand radially outward against the die segments. In order to prevent movement of the die segments outward, a plurality of force members can be operatively connected to the plurality of die segments. The force members can be configured to apply a plurality of discrete forces to the die segments, in some cases through the support members. The discrete forces should be sufficient to retain the plurality of die segments in substantially fixed positions relative to each other during application of force by the pair of anvils. Some minimal movement of die segments can be permissible; however, significant movement can allow for excess material to be forced into spaces between die segments. More importantly, if the die segments are allowed to move significantly, then the pressure within the reaction volume is reduced. Typically, the anvils have a limited distance which they can enter the die chamber, as can be seen in FIG. 4. Thus, when the die segments are allowed to move, the maximum achievable pressure is significantly reduced.

Figure 10:
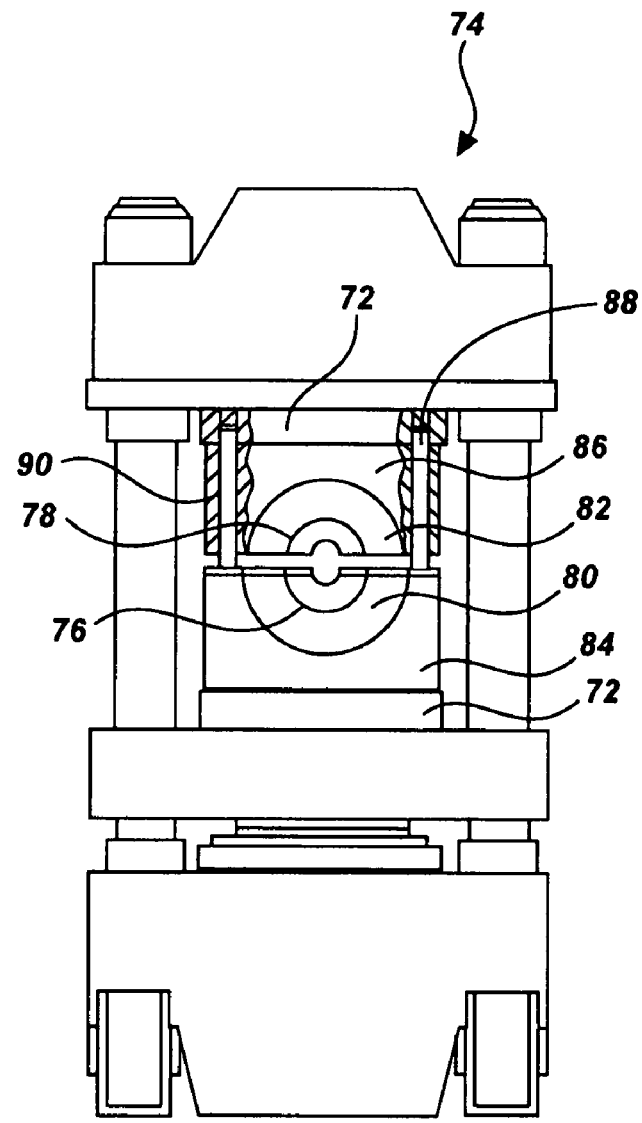
FIG. 10 is a side view of an axial press having two die segments and corresponding support members mounted therein.

In an additional alternative embodiment of the present invention, the anvils can be operatively connected to an aligned column similar to that shown in FIG. 10. An aligned column can help to prevent the anvils from becoming offset or from tilting which typically results in failure of either the die or the anvils.

In accordance with the present invention, the force members can be any device or mechanism capable of applying force sufficient to retain the die segments in substantially fixed positions. Several non-limiting examples of suitable force members include uniaxial presses, hydraulic pistons, and the like. Hydraulic pistons and rams similar to those used in tetrahedral and cubic presses can also be used in the high pressure apparatus of the present invention. Alternatively, the force members can include tie rods and hydraulic pistons similar to those used in a standard cubic press. In one specific embodiment shown in FIG. 10, the force members can be pairs of platen 72 in a uniaxial press 74. Die segments 76 and 78 are held in arcuate support members 80 and 82, respectively. Support members 80 and 82 are also held in additional secondary support members 84 and 86, respectively. The die segments are shown in a separated position. In this position, the die segments and/or support members can be easily replaced or adjusted and a reaction assembly placed therein. Further, subsequent to application of high pressure retraction of the die segments to a separated position can make removal of the high pressure assembly easier than with standard belt dies. In one aspect, wherein four die segments are attached to four corresponding support members, two uniaxial presses can be used to retain the four die segments in substantially fixed positions. The segmented force and associated support members of the present invention can be advantageous in that removal of die segments and opening of the die chamber subsequent to application of high pressure is readily accomplished.

The die segments 76 and 78 can be assembled to form a die chamber by engaging the pair of platen 72 using the uniaxial press 74. As the die segments move towards one another, optional guide pins 88 and 90 can ensure that the die segments are correctly oriented and can help to prevent lateral movement during application of high pressure.

Regardless of the force members used, the force members can be configured to apply discrete forces to the die segments, either directly or via corresponding support members. In one aspect of the present invention, the discrete forces can intersect at a common point and act in a common plane substantially perpendicular to the chamber axis. Typically, the common point is along the chamber axis in order to prevent sliding or offsetting of the die segments with respect to one another.

Figure 5B:
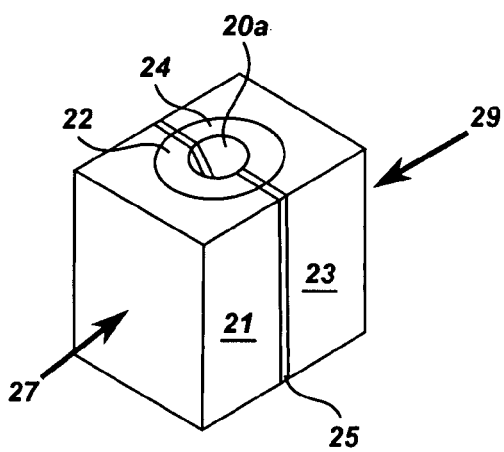
FIG. 5B is a perspective view of the die segments of FIG. 5A assembled to form a die chamber.

Referring to FIG. 5B, the two die segments 22 and 24 are retained together using discrete forces 27 and 29. Discrete forces 27 and 29 can be applied about 180° apart and about 90° to an interface plane defined by the interface of the die segments, corresponding generally to gasket 25. Similarly, three die segments can be retained together using discrete forces. The three discrete forces can act in a common plane about 120° apart and about 60° to the die segment interfaces. FIG. 6B illustrates four die segments 32, 34, 36, and 38 being retained by discrete forces 102, 104, 106, and 108, respectively. Discrete forces 102, 104, 106, and 108 can act in a common plane about 90° apart and about 45° to the die segment interfaces.

The advancing anvils act as a wedge to push the die segments apart; as a result, the amount of force required to retain the die segments together is typically greater than the force applied by the anvils. Therefore, the discrete forces combined can preferably be greater than the combined pressure from the anvils. In one detailed aspect of the present invention, as the pair of anvils advance, pressure is placed on the high pressure assembly such that force is applied radially outward against the die segments. As a result, the combined discrete forces required in order to retain the die segments can be greater than the pressure in the high pressure assembly. In addition, a typical die has an inner surface area larger than the anvils; consequently, the force (i.e. pressure times area) required to retain the die segments together is much larger than the force required to advance the anvils. Typically, anvils can provide a total pressing force of from about 100 metric tons to about 10,000 metric tons, although forces outside this range can be used which are sufficient to achieve the desired pressures.

In accordance with the above principles, the high pressure apparatus of the present invention can produce high pressures within the die chamber. High pressures of over about 2 MPa can be easily achieved. In one aspect, the combined pressing forces are sufficient to provide ultrahigh pressures. In one detailed aspect, the ultrahigh pressures can be from about 1 GPa to about 10 GPa, and preferably from about 2 GPa to about 7 GPa, and most preferably from about 4 to about 6 GPa.

In yet another detailed aspect of the present invention, the support members can be shaped to reduce tensile stress in a corresponding die segment. Application of force to support members such as those shown in FIG. 5B can cause premature failure of the die segments. Specifically, upon applying force to the support members 21 and 23 the die segments can experience a high tensile stress along a circumference direction of the outer surface of the die chamber. This tensile stress tends to cause cracking of the die segments perpendicular to the die bore, wherein cracks have a genesis at the inner surface which then grows toward the outer surface.

Figure 11:
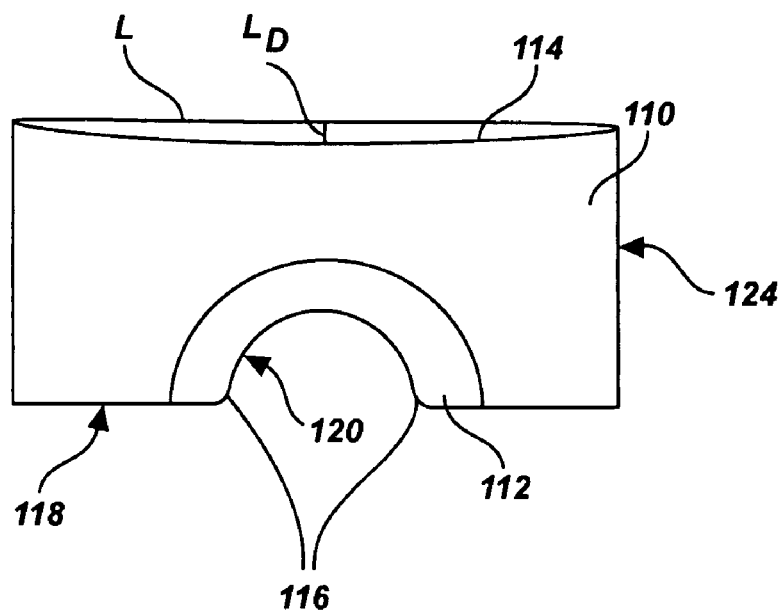
FIG. 11 is a top view of a contoured support member in accordance with an embodiment of the present invention.

FIG. 11 illustrates a support member 110 having a single arcuate die segment 112. The support member has an outer surface 114 which is opposite the die segments. The outer surface can be preferably inwardly contoured to form a profile configured to reduce tensile stress in the die segment. Optionally, a corresponding force member adjacent to the support member can be inwardly contoured to form a similar profile which decreases tensile stress in the die segment during application high pressure.

The inward contour can be a slight inward concavity such as that shown in FIG. 11 (concavity exaggerated for clarity); however the inward contour can also be formed as a beveled surface having substantially flat surfaces which slope inward and meet at a maximum deviation, $L_D$. Other inward contours can also be used which decrease tensile stress at the inner surface of the die segment. The degree of inward contour is slight, and can be measured by the maximum deviation, $L_D$, from a straight line for a given outer surface length (L), i.e. $L_D/L \times 100$. In one aspect, the degree of contour can range from about 0.1% to about 2%; however, values outside this range can also be used. Specific ranges can be calculated based on the die support member size, geometry, materials used in the support member, and number of force members used in a particular design. The degree of contour can be sufficient to distribute applied load such that hoop tension at the die segments can be minimized. Those skilled in the art can make such calculations using their knowledge and readily available software. When the die support member 110 of FIG. 11 is subjected to a discrete force, the outer surface 114 tends to flatten with a large portion of stress being transferred from the more expensive die segment 112 to the support member.

In addition to the contours shown in FIG. 11, the support members can be contoured along the direction of the chamber axis. By contouring the support members in this direction tensile stress along surfaces and in a direction parallel to the chamber axis can be minimized in the die segments and support members. Specifically, tensile stress on the outer surface 114 tends to cause cracks perpendicular to the chamber axis.

Additionally, the die segment 112 can be shaped to reduce stress at corners 116. For example, the corners can be rounded (as shown in FIG. 11), tapered, or beveled. In this way, chipping or fracture of the die segment at a sharp corner can be reduced. Of course, in some embodiments, any gasket material used between die segments having shaped corners 116 can be designed to match the contours of the contact surfaces 118. Preferably, the gasket material can be designed to eliminate or substantially fill any gaps between contact surfaces and/or the reaction assembly.

In yet another alternative embodiment of the present invention, the gasket material and corresponding contact surfaces of the die segments can be contoured to control pressure distribution through the assembled die segments and to reduce premature failure. Under ultrahigh pressures the pressure gradient from the inner surfaces of the die segments to the exterior surfaces of the die segments or supporting members can be very dramatic, i.e. typically from 1 atm (101,325 Pa) to 5.5 GPa. Generally, it is preferable to reduce sharp spikes or drops in pressure which cause additional stress on die segments and support members. For example, the contacting surface 118 can be flat with corresponding gasket materials having a constant thickness from the inner surface 120 of the die segment to the outer surface 124 of the support member. In this case, a majority of the pressure drop occurs near the outer surface resulting in a large stress on the support member 110 in outer regions near the contact surface.

Figure 12:
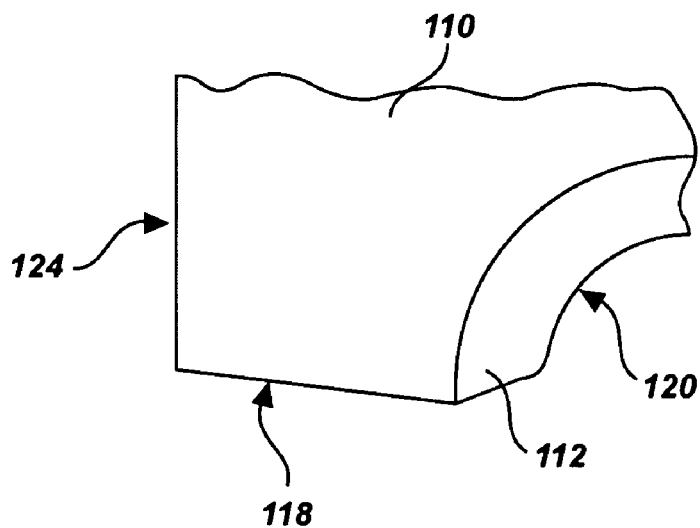
FIG. 12 is a top view of a portion of a support member and die segment having a contoured contact surface in accordance with an embodiment of the present invention.

In order to produce a more uniform pressure gradient, the contact surfaces 118 and corresponding gasket materials can be contoured. FIG. 12 illustrates one embodiment wherein the contact surface is contoured outwardly toward the inner surface 120 and the outer surface 124 with a maximum at the interface between the support member 110 and the die segment 112. The contact surface can be contoured with other configurations such as flat, gradual sloped surfaces, or continuous taper, i.e. from the inner surface to the outer surface. For example, the gasket material can be shaped such that the gasket material is thicker toward the inner surface and tapers to a thinner thickness toward the outer surface. Alternatively, the gasket can have a thicker portion at the inner surface which then tapers to a narrower thickness near the joint between the support member and the die segment at which point the thickness can remain substantially the same or taper either inward or outward. In each of the above cases, the contact surfaces 118 can be contoured to match the gasket shape.

Further, in designing such contoured contact surfaces and corresponding gaskets, a gradual decrease in pressure is desired. Typically, the slope of the pressure change is related to the thickness of the gasket. For example, a thicker gasket can allow for a larger drop in pressure than a thinner gasket. In addition, the difference between a thickest portion of the gasket and a thinnest portion of the gasket is typically very moderate and can be less than about 3:1. Thus, by adjusting the thickness of the gasket material and the associated contact surfaces, the pressure gradient can be controlled to reduce mechanical stress at certain portions of the die segment and/or support members.

The high pressure split die devices described above are particularly suited to growth of crystalline bodies using the aforementioned high pressure reaction assemblies. An additional optional configuration for suitable high pressure reaction assemblies having a controlled pattern of crystalline seeds is described in more detail in U.S. Pat. No. 6,159,286, which is incorporated by reference herein. The high pressure reaction assembly can then be subjected to a temperature and pressure in which diamond or cBN is thermodynamically stable. As the temperature and pressure are increased sufficiently to diamond growth conditions, the catalyst material facilitates growth of crystal at the crystalline seed from the raw material. The growth conditions can be maintained for a predetermined period of time to achieve a specific size of grown crystal.

Typical growth conditions can vary somewhat; however, the temperature can be from about 1000° C. to about 1600° C. and the pressure can be from about 2 to about 7 GPa, and preferably from about 4 to about 6 GPa. The appropriate temperature can depend on the catalyst material chosen. As a general guideline, the temperature can be from about 10° C. to about 200° C. above a melting point of the catalyst. Growth time can typically be from about 5 minutes to several days, and preferably less than about 50 hours.

Figure 13:
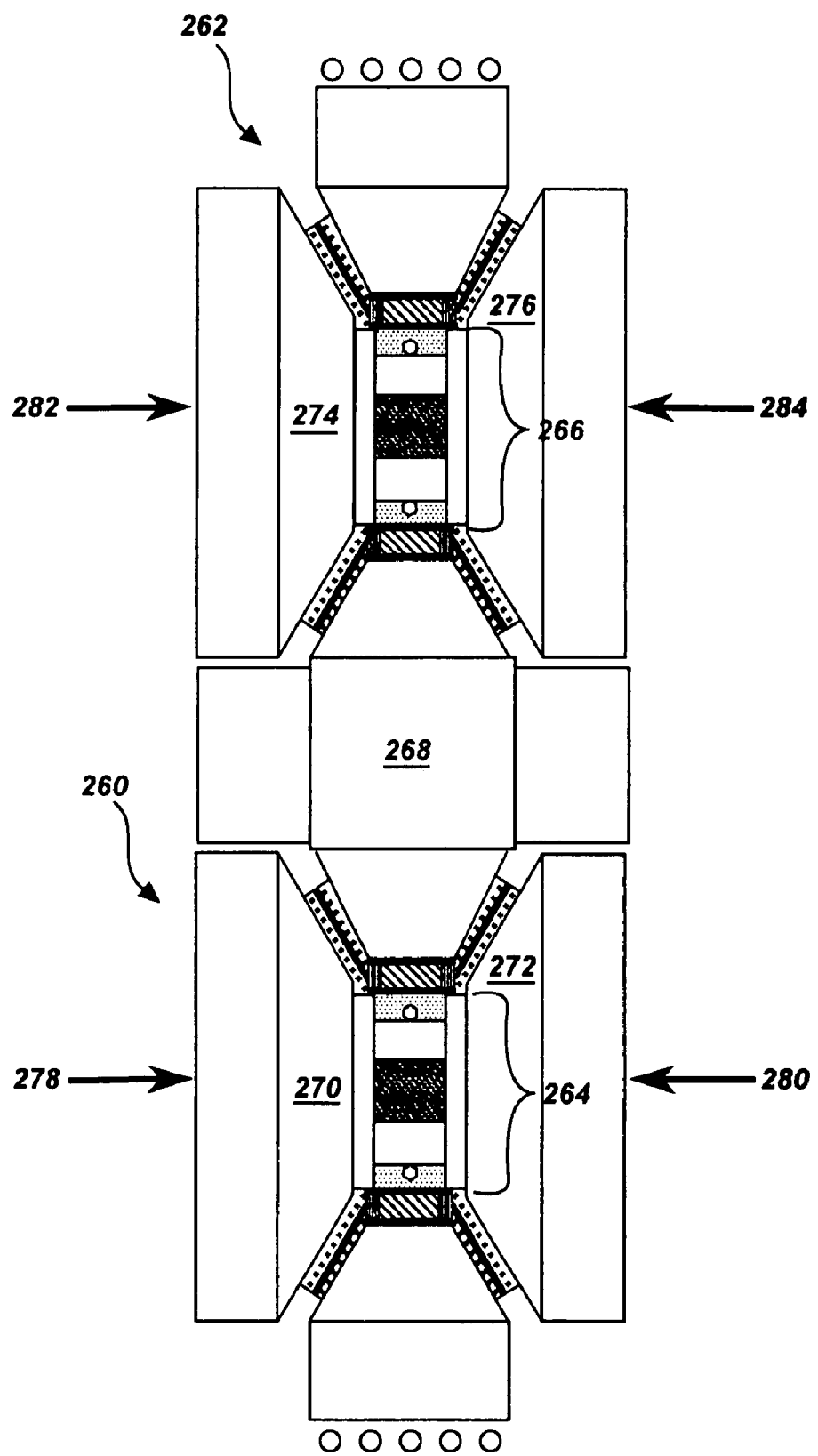
FIG. 13 is a cross-sectional view of a high pressure system in accordance with an embodiment of the present invention having two high pressure apparatuses in series sharing a common anvil.

In addition, the high pressure systems of the present invention can include a plurality of high pressure apparatuses each including at least one growth cell. A plurality of high pressure apparatuses can be oriented in a variety of configurations such as in series or in parallel in order to increase production capacity. In one aspect, a plurality of high pressure devices can be oriented in series. In one alternative embodiment of a series orientation, the high pressure devices can share at least one common anvil having two ends such that a pressing force is applied substantially along the chamber axis of each apparatus. For example, FIG. 13 illustrates two high pressure apparatuses 260 and 262 each having a reaction assembly 264 and 266, respectively. The two high pressure apparatuses can share a common double-sided anvil 268. In this way a common press or device can be used to provide the pressing force for both high pressure apparatuses. In order to allow the anvils to move in order to compensate for volume reduction during high pressure growth the high pressure apparatuses can be configured to allow lateral movement. For example, each high pressure apparatus can have separate force members, e.g., uniaxial presses, which are mounted on a track, wheels, bearings, or the like which allows each of the anvils to enter the die bore at substantially equal rates.

Although any suitable high pressure device can be used to provide the pressure members, in one preferred embodiment, the high pressure apparatuses can include pressure members which are split die segments 270, 272, 274 and 276. As such, a plurality of discrete forces 278, 280, 282 and 284, respectively, can be applied to the die segments to retain the segments together during application of the pressing force.

Figure 14:
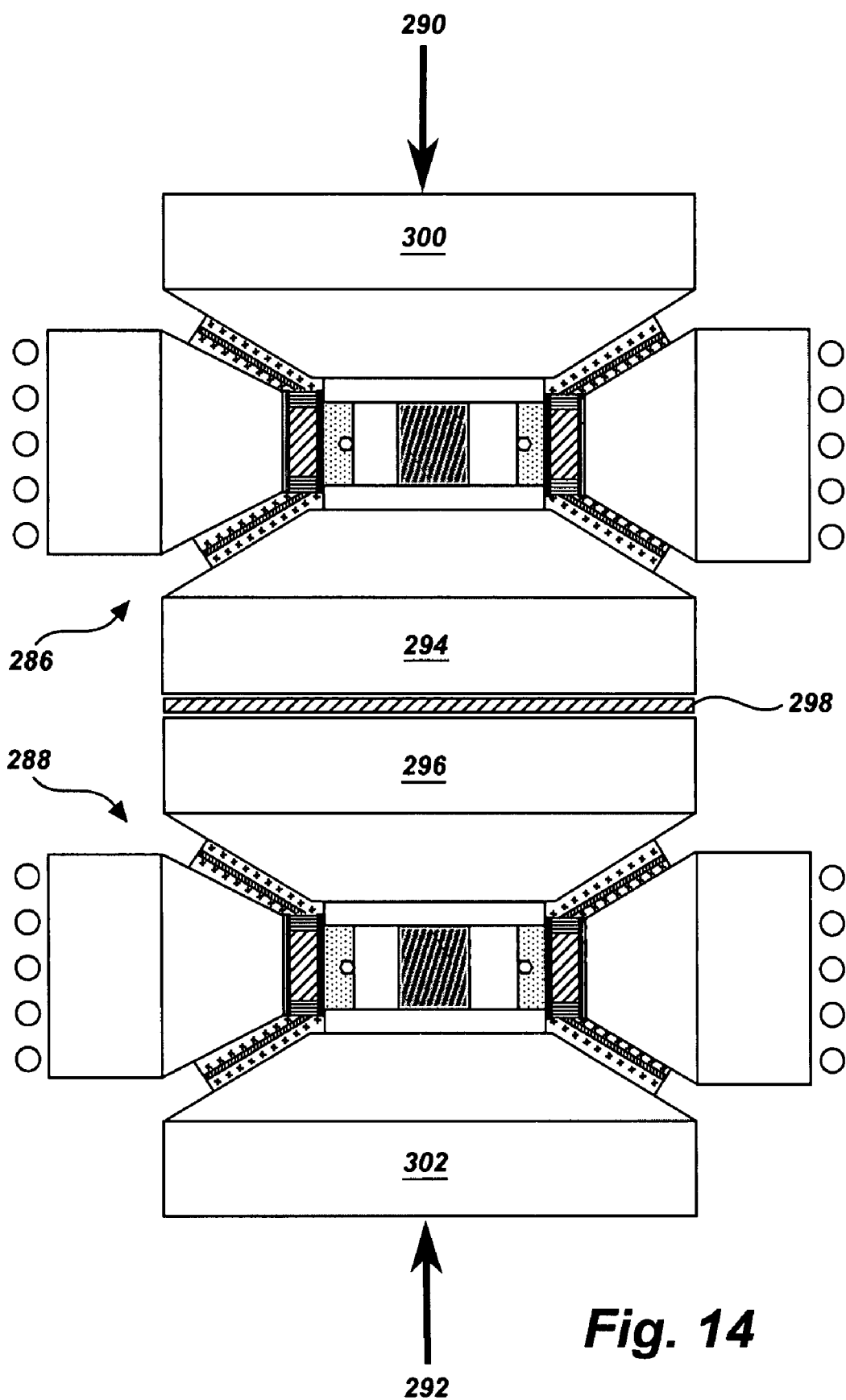
FIG. 14 is a cross-sectional view of a high pressure system in accordance with an embodiment of the present invention having two high pressure apparatuses in parallel sharing common discrete forces.

In another alternative embodiment, the high pressure system of the present invention can include a plurality of high pressure apparatuses oriented in parallel. FIG. 14 illustrates two high pressure apparatuses 286 and 288 oriented in parallel and sharing common force members. Specifically, force members can apply discrete forces 290 and 292. Adjacent high pressure apparatuses can share a common support member. Alternatively, as shown in FIG. 14, support members 294 and 296 can be separated by a gasket 298. In effect, discrete force 290 is applied to support members 300 and 296, while discrete force 292 is applied to support members 302 and 294.

Figure 15:
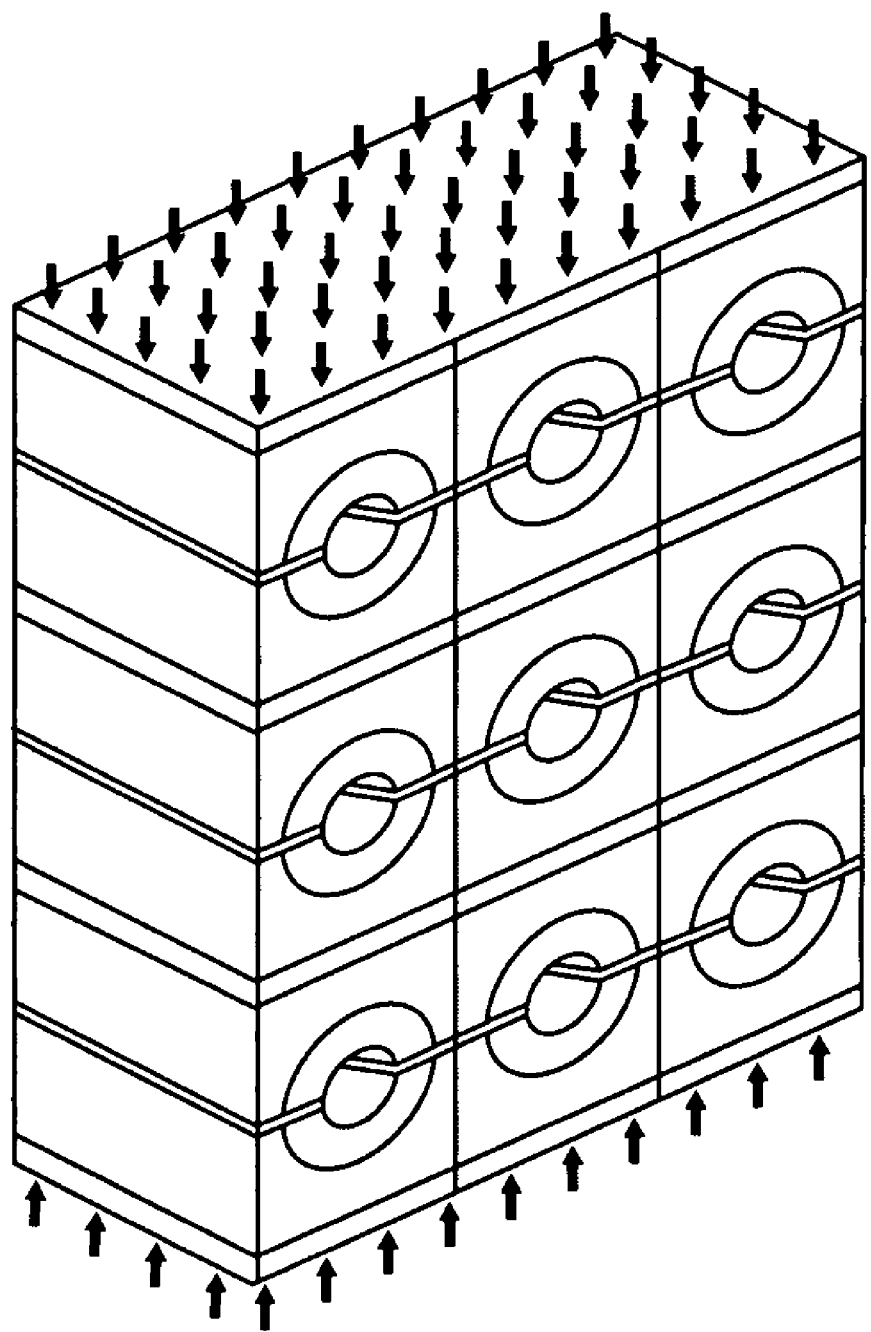
FIG. 15 is a perspective view of a high pressure system in accordance with an embodiment of the present invention having a plurality of high pressure apparatuses oriented in parallel.

In one aspect of the present invention, the number of reaction assemblies and/or high pressure apparatuses can be increased while the die chambers of each apparatus can be decreased in size. This allows for an increased number of growth cells having individual control of growth conditions for each crystalline seed for synthesis of high quality gem diamonds. FIG. 15 illustrates one embodiment of the present invention, including nine high pressure apparatuses oriented in parallel. Each of the high pressure apparatuses can have several growth cells, with each growth cell being maintained at optimal growth conditions. The size of each die chamber allows for substantially unimpeded growth of each crystal. Orienting a plurality of high pressure apparatuses can allow for increased production throughput, while also allowing for individual control of growth conditions within each high pressure growth cell. This is particularly advantageous when using the high pressure split die devices described herein, which offer improved access to the die chamber and improved monitoring and control of temperature conditions of each growth cell.

In either the series or parallel configurations it can often be desirable to design one or more of the devices applying pressing or discrete forces to be movable in order to allow the forces and die segments to remain aligned. For example, in FIG. 13 high pressure apparatuses 260 and 262 may need to move slightly together in order to prevent uneven entrance of the common anvil 268 and anvils 286 and 288 into their respective die chambers. This movement can be provided using any known hardware such as wheels, tracks, bearings, and the like attached to the devices used to provide the pressing and/or discrete forces.

The apparatuses and methods of the present invention can provide additional control and improved quality of individual grown crystals. The chamber axis 26 of the die chamber 20 can be vertical as shown in FIG. 4. However, as discussed above the chamber axis can preferably be oriented substantially perpendicular to gravity prior to application of force by the anvils as shown in FIGS. 1 through 3 and 9 through 15. Depending on the composition of the high pressure assembly, a horizontal orientation of the assembly axis can help to reduce problems associated with differences in density and temperature gradients during diamond synthesis. For example, during synthesis of diamond, the catalyst is substantially molten such that lower density diamond (3.5 g/cm$^3$) tends to float on the more dense molten catalyst (density greater than 8 g/cm$^3$). Moreover, the molten catalyst may flow upward via convection, if the lower portion of the molten catalyst is at a higher temperature than an upper portion. Such flow of molten catalyst or diamond is not desirable, e.g., under the temperature gradient method of diamond synthesis, convection can increase diffusion of carbon solute sufficient to disturb the growth rate of the seeded diamond resulting in non-homogeneous crystal formation and defects. Thus, one aspect of the present invention can include orienting the assembly axis, and typically the chamber axis, substantially perpendicular to gravity in order to eliminate or substantially reduce such effects.

In addition, in accordance with the present invention, temperature profiles within the plurality of growth cells can be actively controlled in order to maintain optimal growth conditions for each crystalline seed. Typically, in accordance with the temperature gradient method, each growth surface and/or crystalline seed can have a lower temperature than a corresponding raw material flux surface. Typically, the temperature profile within each growth cell can be a negative gradient from the raw material to the crystalline seed. The temperature difference can vary, but is typically from about 20° C. to about 50° C. Further, temperature fluctuations at the crystalline seed below about 10° C. are desirable in order to avoid defects or inclusions in a growing crystal.

A variety of mechanisms can be used in order to maintain a desired temperature profile across the reaction assembly. Heating elements can be provided in thermal contact with the raw material. Suitable heating elements can include, but are not limited to, passing a current through low resistivity raw material, heating tubes, and the like. Similarly, the crystalline seed and growth surface can be cooled by thermal contact with cooling elements. Suitable cooling elements can include, but are not limited to, cooling tubes, refrigerants, and the like. Cooling elements can be placed adjacent existing pressure members or can be formed as an integral part of pressure members or reaction assemblies. For example, FIG. 1 shows cooling tubes 304 and 306 adjacent anvils 202 and 204, respectively. In this case, the cooling tubes can contain a coolant liquid such as water or ethylene glycol. The anvils are typically formed of a relatively high thermal conductivity metal such as steel or metal carbide. Heat can be removed from ends of the reaction assembly 210 via transfer through the anvils. Alternatively, additional cooling elements can be added in embodiments including a plurality of growth cells and/or reaction assemblies. For example, FIG. 2 illustrates two reaction assemblies 242 and 244 sharing a common support layer 246. In this embodiment, it can be desirable to include cooling elements 308 and 310 near the support layer which are integral with the support members 312 and 314, respectively. Of course, the cooling elements can be placed as close as possible to the crystalline seeds, while also retaining the structural integrity of support members and die segments under high pressures.

As an additional aid to actively controlling temperature profiles, thermocouples can be used to measure temperature profile. Thermocouples can be placed at various locations within each growth cell to determine whether temperatures are being maintained within optimal growth conditions. The heating and cooling elements can then be adjusted to provide adequate heating or cooling. Typical feedback schemes can be used to reduce fluctuations in temperature control, i.e. PID, PI, etc. Active control of temperature profiles can be especially convenient when using the split dies described herein. The breaks in the die segments allow for more direct access to the reaction assembly and high pressure volume for thermocouples and heating or cooling elements. Thus, the growth conditions for each crystalline seed can be independently controlled.

As a result of the present invention, improved crystals can be grown having high yield, increased throughput capacity, and increased gem quality. Although yield varies depending on the materials used, the methods of the present invention can produce high quality and gem quality diamonds and crystals having a yield of from about 2 to over 50 gem quality diamonds, each larger than 1 carat, during each pressing cycle. This throughput of diamond is much higher than conventional methods which are typically limited to a single crystal larger than 1 carat grown at optimal growth conditions.

In one embodiment of the present invention, diamond seeds can be grown to form gem quality diamonds. Growth rates of crystal can be from about 1 mg/hr to about 10 mg/hr, and preferably from about 4 mg/hr to about 6 mg/hr. The final grown crystals can have varying sizes depending on the size of the crystalline seed and growth time. However, gem quality diamonds can have a size of from about 0.5 carat to about 30 carats, and preferably from about 1 carat to about 5 carats.

Thus, there is disclosed an improved high pressure apparatus and methods for applying high pressure and ultrahigh pressure to materials. The above description and examples are intended only to illustrate certain potential embodiments of this invention. It will be readily understood by those skilled in the art that the present invention is susceptible of a broad utility and applications. Many embodiments and adaptations of the present invention other than those herein described, as well as many variations, modifications and equivalent arrangements will be apparent from or reasonably suggested by the present invention and the foregoing description thereof without departing from the substance or scope of the present invention. Accordingly, while the present invention has been described herein in detail in relation to its preferred embodiment, it is to be understood that this disclosure is only illustrative and exemplary of the present invention and is made merely for purpose of providing a full and enabling disclosure of the invention. The foregoing disclosure is not intended or to be construed to limit the present invention or otherwise to exclude any such other embodiment, adaptations, variations, modifications and equivalent arrangements, the present invention being limited only by the claims appended hereto and the equivalents thereof.

What is claimed is:

1. A method of growing crystalline bodies at high pressures, comprising:
   a) providing a high pressure apparatus having a die chamber and a high pressure volume within the die chamber, said die chamber having a chamber axis;

b) assembling a high pressure reaction assembly having a plurality of crystalline growth cells aligned substantially along an assembly axis, each growth cell including a crystalline seed, a catalyst layer, and a raw material layer;

c) placing said high pressure reaction assembly at least partially within the high pressure volume such that the assembly axis is oriented substantially perpendicular to gravity;

d) applying a pressing force to the reaction assembly substantially along the chamber axis which is sufficient to provide high pressures within the reaction assembly; and e) actively controlling temperature profiles within the plurality of growth cells, such that each crystal growth surface has a lower temperature than a corresponding raw material flux surface, including providing cooling elements in thermal contact with the crystal growth surfaces.

2. The method of claim 1, further comprising the step of orienting the high pressure apparatus prior to applying a pressing force, such that said chamber axis is substantially perpendicular to gravity.

3. The method of claim 1, wherein each crystalline growth cell comprises:
a) the catalyst layer having a crystal growth surface and a raw material flux surface;
b) the crystalline seed contacting the catalyst layer; and
c) the raw material layer adjacent the raw material flux surface, the raw material layer being configured to allow raw material to diffuse into the catalyst layer along a bulk raw material diffusion direction which corresponds generally to the assembly axis.

4. The method of claim 1, wherein the high pressure apparatus is selected from the group consisting of split die device, girdle device, belt device, piston-cylinder press, and toroidal device.

5. The method of claim 4, wherein the high pressure apparatus is a split die device.

6. The method of claim 5, wherein the pressing force is sufficient to provide ultrahigh pressures.

7. The method of claim 6, wherein the ultrahigh pressures are from about 4 GPa to about 7 GPa.

8. The method of claim 1, wherein the step of actively controlling temperature profiles includes providing heating elements in thermal contact with the raw material layers.

9. The method of claim 8, wherein the crystalline seeds are diamond seeds and during the step of applying a pressing force the diamond seeds grow to form gem quality diamonds.

10. The method of claim 9, wherein said gem quality diamonds have a size of from about 0.25 carat to about 25 carats.

11. The method of claim 1, wherein the crystalline seed is contacting the crystal growth surface and is substantially surrounded by a support layer.

12. The method of claim 11, wherein the support layer substantially comprises NaCl.

13. The method of claim 1, wherein the step of assembling further comprises assembling a plurality of high pressure reaction assemblies.

14. The method of claim 13, wherein the plurality of reaction assemblies is placed within the high pressure volume in a series relationship and wherein the assembly axes are each oriented substantially perpendicular to gravity.

15. The method of claim 13, further comprising a plurality of high pressure apparatuses oriented in parallel, wherein the plurality of reaction assemblies is placed in the high pressure volumes of the plurality of high pressure apparatuses.

16. The method of claim 13, further comprising a plurality of high pressure apparatuses oriented in series, wherein the plurality of reaction assemblies is placed in the high pressure volumes of the plurality of high pressure apparatuses.

17. A method of growing crystalline bodies at high pressures, comprising:
a) forming a reaction assembly including at least one crystalline seed, a catalyst layer, and a raw material layer, said reaction assembly being configured for temperature gradient controlled growth having a temperature gradient from the crystalline seed to the raw material;
b) orienting the reaction assembly such that the temperature gradient is substantially perpendicular to gravity; and
c) applying high pressure and high temperature sufficient to cause diffusion of raw material along a bulk diffusion direction such that the raw material layer has a temperature higher than a temperature of the crystalline seed.

* * * * *